United States Patent
Matsuda

(10) Patent No.: US 12,176,457 B2
(45) Date of Patent: Dec. 24, 2024

(54) LIGHT EMITTING DEVICE INCLUDING COVERING MEMBER AND EXTERNAL CONNECTION ELECTRODES

(71) Applicant: NICHIA CORPORATION, Anan (JP)

(72) Inventor: Yoshikazu Matsuda, Tokushima (JP)

(73) Assignee: NICHIA CORPORATION, Anan (JP)

( * ) Notice: Subject to any disclaimer, the term of this patent is extended or adjusted under 35 U.S.C. 154(b) by 437 days.

(21) Appl. No.: 17/362,066

(22) Filed: Jun. 29, 2021

(65) Prior Publication Data

US 2021/0328097 A1 Oct. 21, 2021

Related U.S. Application Data

(63) Continuation of application No. 16/983,231, filed on Aug. 3, 2020, now Pat. No. 11,063,176, which is a (Continued)

(30) Foreign Application Priority Data

Dec. 21, 2015 (JP) .................................. 2015-248382
Sep. 23, 2016 (JP) .................................. 2016-185078

(51) Int. Cl.
*H01L 33/00* (2010.01)
*H01L 33/48* (2010.01)

(52) U.S. Cl.
CPC ........ *H01L 33/0095* (2013.01); *H01L 33/486* (2013.01); *H01L 2224/18* (2013.01); *H01L 2933/0066* (2013.01)

(58) Field of Classification Search
CPC ........... H01L 2224/48091; H01L 33/62; H01L 2924/00014; H01L 2924/00; H01L 33/60
See application file for complete search history.

(56) References Cited

U.S. PATENT DOCUMENTS 6,331,063 B1 12/2001 Kamada et al.
9,360,204 B2 6/2016 Fukuda et al.
(Continued)

FOREIGN PATENT DOCUMENTS

JP  S61-098324 A  5/1986
JP  H11-163412 A  6/1999
(Continued)

OTHER PUBLICATIONS

Final Office Action on U.S. Appl. No. 15/385,553 DTD May 16, 2018.
(Continued)

*Primary Examiner* — Tony Tran
(74) *Attorney, Agent, or Firm* — Foley & Lardner LLP

(57) ABSTRACT

A light emitting device includes: a first light emitting element that comprises a pair of first electrodes; a second light emitting element that comprises a pair of second electrodes; a covering member that integrally covers the first and second light emitting elements such that lower surfaces of the pair of first electrodes and lower surfaces of the pair of second electrodes are exposed from a lower surface of the covering member; a pair of first external connection electrodes, each comprising: a first portion that covers the lower surface of a respective first electrode, and a second portion that covers a portion of the lower surface of the covering member; and a pair of second external connection electrodes, each comprising: a first portion that covers the lower surface of a respective second electrode, and a second portion that covers a portion of the lower surface of the covering member.

14 Claims, 22 Drawing Sheets

Related U.S. Application Data continuation of application No. 16/231,105, filed on Dec. 21, 2018, now Pat. No. 10,770,618, which is a continuation of application No. 15/385,553, filed on Dec. 20, 2016, now Pat. No. 10,199,533.

(56) References Cited

U.S. PATENT DOCUMENTS

| | | | |
|---|---|---|---|
| 9,704,793 B2* | 7/2017 | Sekine | H01L 23/3677 |
| 9,810,381 B2* | 11/2017 | Togawa | H01L 25/0753 |
| 2002/0006040 A1 | 1/2002 | Kamada et al. | |
| 2008/0142822 A1 | 6/2008 | Kim et al. | |
| 2011/0297983 A1* | 12/2011 | Nishiuchi | H01L 33/647 |
| | | | 257/98 |
| 2011/0303940 A1* | 12/2011 | Lee | H01L 33/62 |
| | | | 257/91 |
| 2012/0056229 A1 | 3/2012 | Hsu | |
| 2012/0302124 A1* | 11/2012 | Imazu | H01L 33/486 |
| | | | 445/58 |
| 2014/0339587 A1 | 11/2014 | Kawaguchi et al. | |
| 2015/0295152 A1* | 10/2015 | Yoneda | H01L 33/62 |
| | | | 257/98 |
| 2016/0284940 A1 | 9/2016 | Kawaguchi et al. | |
| 2016/0351765 A1 | 12/2016 | Suzuki | |
| 2017/0301844 A1 | 10/2017 | Yoneda et al. | |
| 2018/0102460 A1 | 4/2018 | Kawaguchi et al. | |

FOREIGN PATENT DOCUMENTS

| | | |
|---|---|---|
| JP | 2004-356129 A | 12/2004 |
| JP | 2008-153612 A | 7/2008 |
| JP | 2010-085493 A | 4/2010 |
| JP | 2011-258671 A | 12/2011 |
| JP | 2012-015187 A | 1/2012 |
| JP | 2012-124342 A | 6/2012 |
| JP | 2012-124443 A | 6/2012 |
| JP | 2012-138454 A | 7/2012 |
| JP | 2012-146942 A | 8/2012 |
| JP | 2012-227470 A | 11/2012 |
| JP | 2014-241401 A | 12/2014 |
| JP | 2015-119014 A | 6/2015 |
| JP | 2015-201605 A | 11/2015 |
| WO | WO-2011/093454 A1 | 4/2011 |

OTHER PUBLICATIONS

Final Office Action on U.S. Appl. No. 16/231,105 DTD Nov. 21, 2019.

Japanese Patent No. 2012-146942 [machine's translation].

Non-Final Office Action on U.S. Appl. No. 16/231,105 DTD Jul. 16, 2019.

Non-Final Office Action on U.S. Appl. No. 16/983,231 DTD Sep. 28, 2020.

Notice of Allowance on U.S. Appl. No. 15/385,553 DTD Oct. 1, 2018.

Notice of Allowance on U.S. Appl. No. 16/231,105 DTD May 4, 2020.

Notice of Allowance on U.S. Appl. No. 16/231,105 DTD May 15, 2020.

Notice of Allowance on U.S. Appl. No. 16/983,231 DTD Mar. 9, 2021.

Office Action on U.S. Appl. No. 15/385,553 DTD Jan. 11, 2018.

* cited by examiner

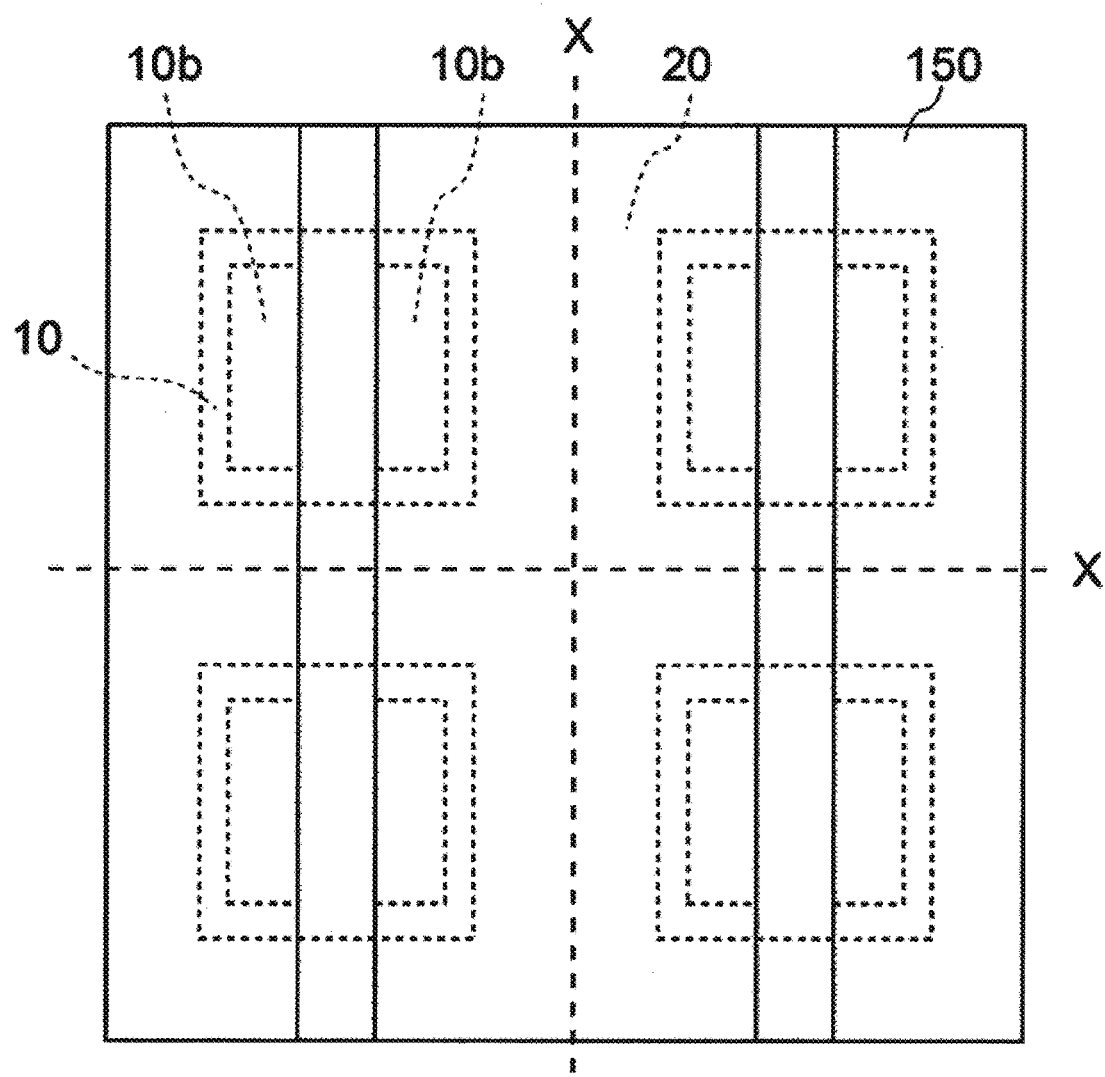

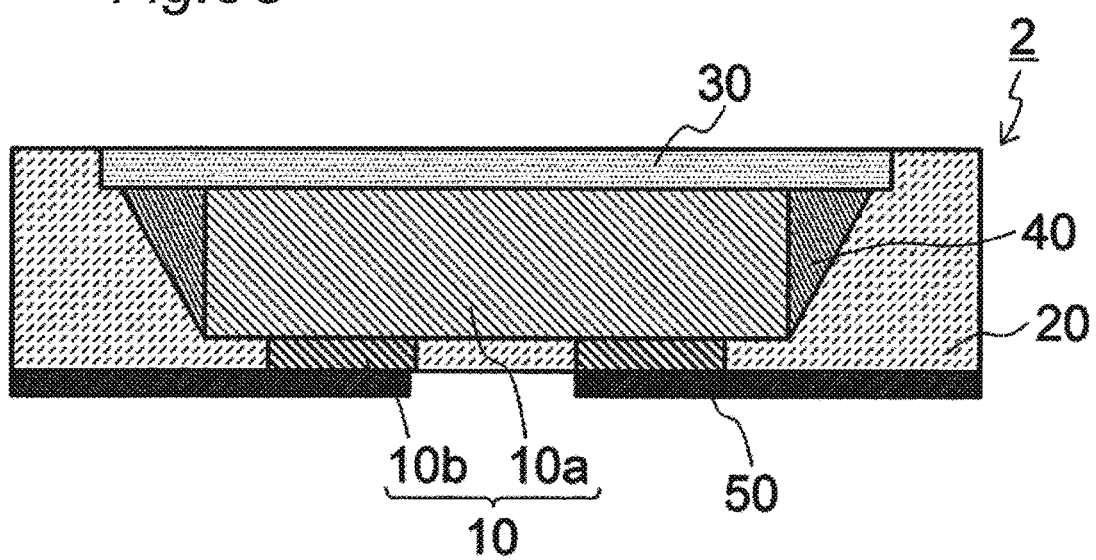

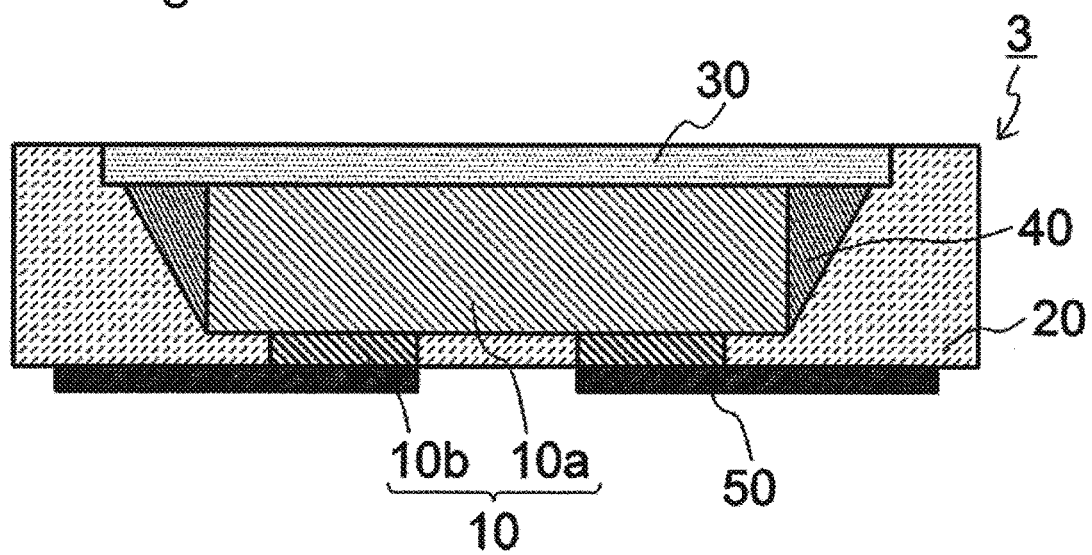

LIGHT EMITTING DEVICE INCLUDING COVERING MEMBER AND EXTERNAL CONNECTION ELECTRODES

CROSS-REFERENCE TO RELATED APPLICATIONS

The present application is a continuation of U.S. patent application Ser. No. 16/983,231, filed on Aug. 3, 2020, which is a continuation of U.S. patent application Ser. No. 16/231,105, filed on Dec. 21, 2018, now U.S. Pat. No. 10,770,618, which is a continuation of U.S. patent application Ser. No. 15/385,553, filed on Dec. 20, 2016, now U.S. Pat. No. 10,199,533, which is based on and claims priority of Japanese Patent Application No. 2015-248382 filed on Dec. 21, 2015, and Japanese Patent Application No. 2016-185078 filed on Sep. 23, 2016, the contents of which are hereby incorporated by reference in their entireties.

BACKGROUND

The present disclosure relates to a method of manufacturing a light emitting device.

A small-sized light emitting device is known in which, instead of providing a housing for accommodating a light emitting element, lateral surfaces and a lower surface of a light emitting element are covered with a seal member containing a reflective material and plated electrodes are provided to be in contact with lower surfaces of bump electrodes of the light emitting element and a lower surface of the seal member (see, for example, JP 2012-124443 A).

SUMMARY

Formation of plated electrodes requires providing a mask or the like, which leads to an increase in the number of steps in the method of manufacturing the light emitting device.

Certain embodiments of the present invention include the following features.

A method of manufacturing a light emitting device according to one embodiment includes providing an intermediate member including at least one light emitting element each includes a plurality of electrodes arranged on a same surface side thereof and a covering member covering the at least one light emitting element so as to expose at least a portion of a surface of each of the plurality of electrodes, forming a metal layer continuously covering an exposed portion of the plurality of electrodes and the covering member, and remove a portion of the metal layer by irradiating the metal layer with laser light to form a plurality of external connection electrodes spaced apart from each other, each of the plurality of external connection electrodes having an area larger than an area of respective ones of the plurality of electrodes.

With these features, a small-sized light emitting device can be obtained easily.

BRIEF DESCRIPTION OF THE DRAWINGS

FIG. 4 is another schematic plan view illustrating the method of manufacturing the light emitting device according to the first embodiment.

FIG. 5C is a schematic cross-sectional view taken along the line II-II of FIG. 5A.

FIG. 8C is a schematic cross-sectional view taken along the line of FIG. 8A.

DETAILED DESCRIPTION

Figure 1A:
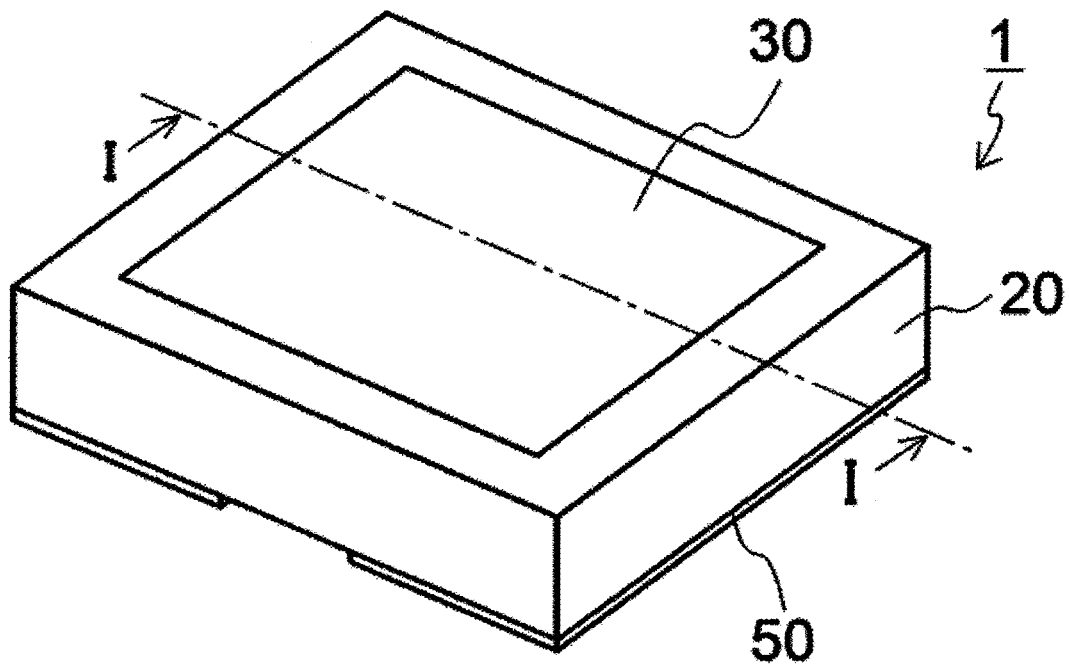
FIG. 1A is a schematic perspective view of a light emitting device according to a first embodiment when viewed obliquely from an upper side.

Certain embodiments of the present invention will be described in detail below with reference to the accompanying drawings. In the description below, the terms indicative of specific directions or positions (e.g., upper, lower, right, left, and other words including these words) are used as appropriate. The use of these terms is to make the understanding of the present invention easy with reference to the drawings, and does not limit the technical scope of the present invention by their meanings. The same reference numerals will be used throughout the drawings to refer to the same or like parts or members. Resin members such as a first light-transmissive member, a second light-transmissive member, and a covering member, will be described using the same respective names regardless of modification, solidification, hardening, and before and after singulation. That is, a member that can exist in different states depending on the stage of steps will be constantly described by the same name, for example, in the case where the member being liquid before molding is molded into a solid and such solid is divided into a different shape.

In one embodiment, a method is provided for manufacturing a light emitting device that includes at least one light emitting element with a plurality of electrodes, a covering member covering the light emitting element, and external connection electrodes each connected to a portion of the plurality of electrodes exposed from the covering member, while each of the plurality of electrodes further includes a portion covered by the covering member. The method includes forming a metal layer continuously covering the plurality of electrodes and the covering member, and remove a portion of the metal layer by irradiating a portion of the metal layer on the covering member located between the plurality of electrodes with laser light to form the external connection electrodes each having an area larger than an area of respective one of the plurality of electrodes.

Irradiation of the metal layer with the laser light causes laser ablation, which allows for removing a portion of the metal layer on an intermediate member. In this manner, the metal layer is patterned, so that the metal layer can serve as the external connection electrodes. The laser ablation is a phenomenon in which irradiation of laser light with intensity of a certain value (threshold) or greater to a surface of a solid allows the irradiated portion of the surface to be removed. Using the laser ablation allows for patterning the metal layer without using a mask or the like.

First Embodiment

Figure 1B:
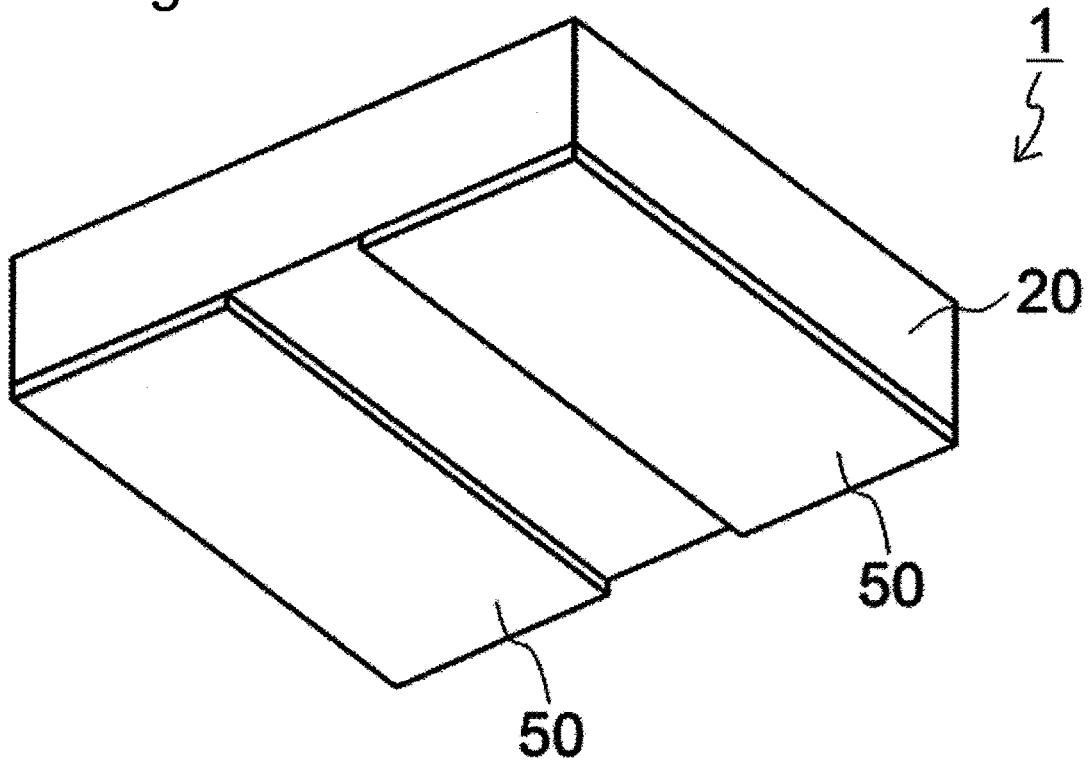
FIG. 1B is a schematic perspective view of the light emitting device according to the first embodiment when viewed obliquely from a lower side.
Figure 1C:
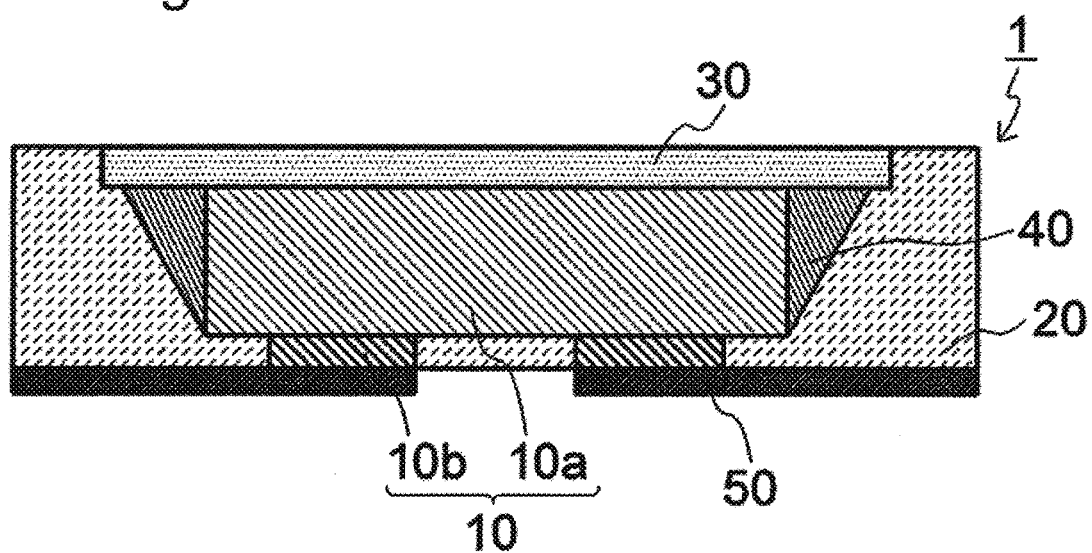
FIG. 1C is a schematic cross-sectional view taken along the line I-I of FIG. 1A.

FIGS. 1A to 1C illustrate a light emitting device 1 produced by a method of manufacturing a light emitting device according to a first embodiment. The light emitting device 1 includes a light emitting element 10, a covering member 20, light-transmissive members 30 and 40, and a plurality of external connection electrodes 50. The light emitting element 10 includes a layered structure body 10a including semiconductor layers and a pair of electrodes 10b disposed at a surface of the layered structure body 10a (e.g., the lower surface, as shown in FIG. 1C).

The covering member 20 covers the lower surface and lateral surfaces of the light emitting element 10 such that a surface of each of the pair of electrodes 10b is exposed. The covering member 20 can be formed in one, or in two or more steps. Regarding the covering member 20 formed through a plurality of steps, the illustration of the boundaries between layers in the covering member 20 formed in each step may be omitted.

The light-transmissive members include a first light-transmissive member 30 that covers an upper surface of the light emitting element 10 (which refers to the upper surface in FIG. 1C, and is opposite to a surface provided with electrodes), and a second light-transmissive member that covers the lateral surfaces of the light emitting element 10 (which refers to left and right surfaces of the light emitting element in FIG. 1C). Each of the external connection electrodes 50 is respectively connected to a respective one of the plurality of the electrodes 10b of the light emitting element 10.

Each of the external connection electrodes 50 has an area larger than that of the respective one of the electrodes 10b connected thereto. In other words, the external connection electrodes 50 are arranged to continuously cover the electrodes 10b of the light emitting element and the covering member 20.

Such a light emitting device 1 can be formed through the steps of:

(1) providing an intermediate member that includes at least one light emitting element including a plurality of electrodes arranged on a same surface side thereof, and a covering member that covers the light emitting element so as to expose at least a portion of a surface of each of the pair of electrodes;

(2) forming a metal layer that continuously covers the exposed portion of the pair of electrodes and the covering member; and (3) irradiating the metal layer with laser light to remove a part of the metal layer to form a plurality of external connection electrodes that are spaced apart from each other, each of the plurality of external connection electrodes having an area larger than an area of a respective one of the plurality of electrodes.

Each step will be described in detail below with reference to FIGS. 2A to 2E.

Providing Intermediate Member

Figure 2A:
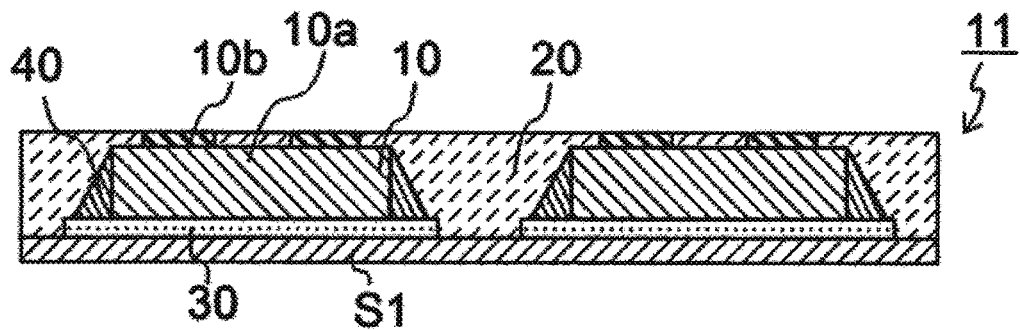
FIGS. 2A to 2E are schematic cross-sectional views illustrating a method of manufacturing the light emitting device according to the first embodiment.

As illustrated in FIG. 2A, an intermediate member 11 is provided that includes the light emitting elements 10 and the covering member 20. Each of the light emitting elements 10 includes the layered structure body 10a and the plurality of electrodes 10b arranged at the same surface side of the layered structure body 10a. The covering member 20 covers the light emitting elements 10 to expose a portion of each of a surface of each of the plurality of electrodes 10b. One intermediate member includes a plurality of light emitting elements 10.

The light emitting elements are arranged regularly in the longitudinal and lateral directions and integrally covered by the covering member 20. Note that for convenience in description, in each of the figures illustrating steps (e.g., FIGS. 2A to 2E), two light emitting elements are illustrated. However, any number of light emitting elements may be employed.

A distance between the light emitting elements can be selected as appropriate, according to the size of a light emitting device to be obtained, the size of the light emitting element, or the like. In view of cutting and singulating of the coating member in a subsequent step, the light emitting elements is arranged also considering the width of a portion to be removed by cutting (the width of a cutting edge) or the like.

In FIG. 2A, the intermediate member 11 is shown that includes the first light-transmissive member 30 disposed on a lower surface of each of the light emitting elements 10 (the lower surface is opposed to the surface provided with the electrodes) and the second light-transmissive member 40 disposed on the left and right lateral surfaces of the light emitting element 10 in a cross-sectional view. However, these light-transmissive members may be omitted. The intermediate member 11 is disposed on a support member S1 such that a surface of the intermediate member 11 not provided with the electrodes 10b (in FIG. 2A, a surface provided with the first light-transmissive member 30) faces the support member S1.

Forming Metal Layer

Figure 2B:
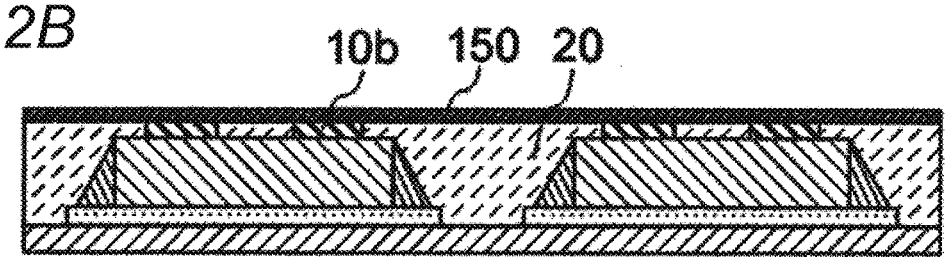

Next, as shown in FIG. 2B, a metal layer 150 is formed to continuously cover the exposed parts of the pair of electrodes 10b and the covering member 20. The metal layer 150 can be formed by a sputtering method, a vapor deposition method, an atomic layer deposition (ALD) method, a metal organic chemical vapor deposition (MOCVD) method, a plasma-enhanced chemical vapor deposition (PECVD) method, an atmospheric pressure plasma deposition method, or the like.

Forming External Connection Electrode

In the first embodiment, the step of forming the external connection electrodes includes a sub-step of irradiating with laser light and a sub-step of singulating.

Figure 2C:
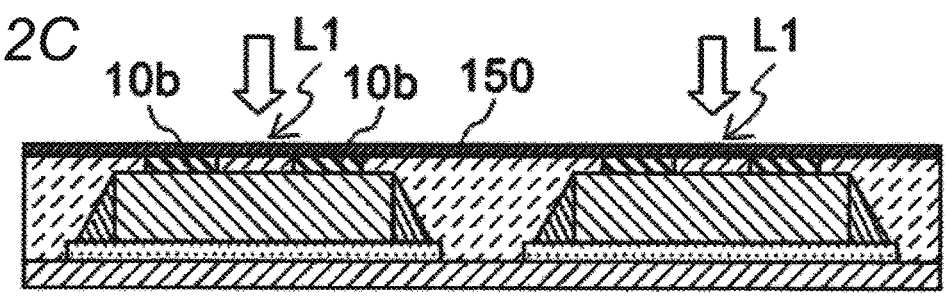
Figure 3:
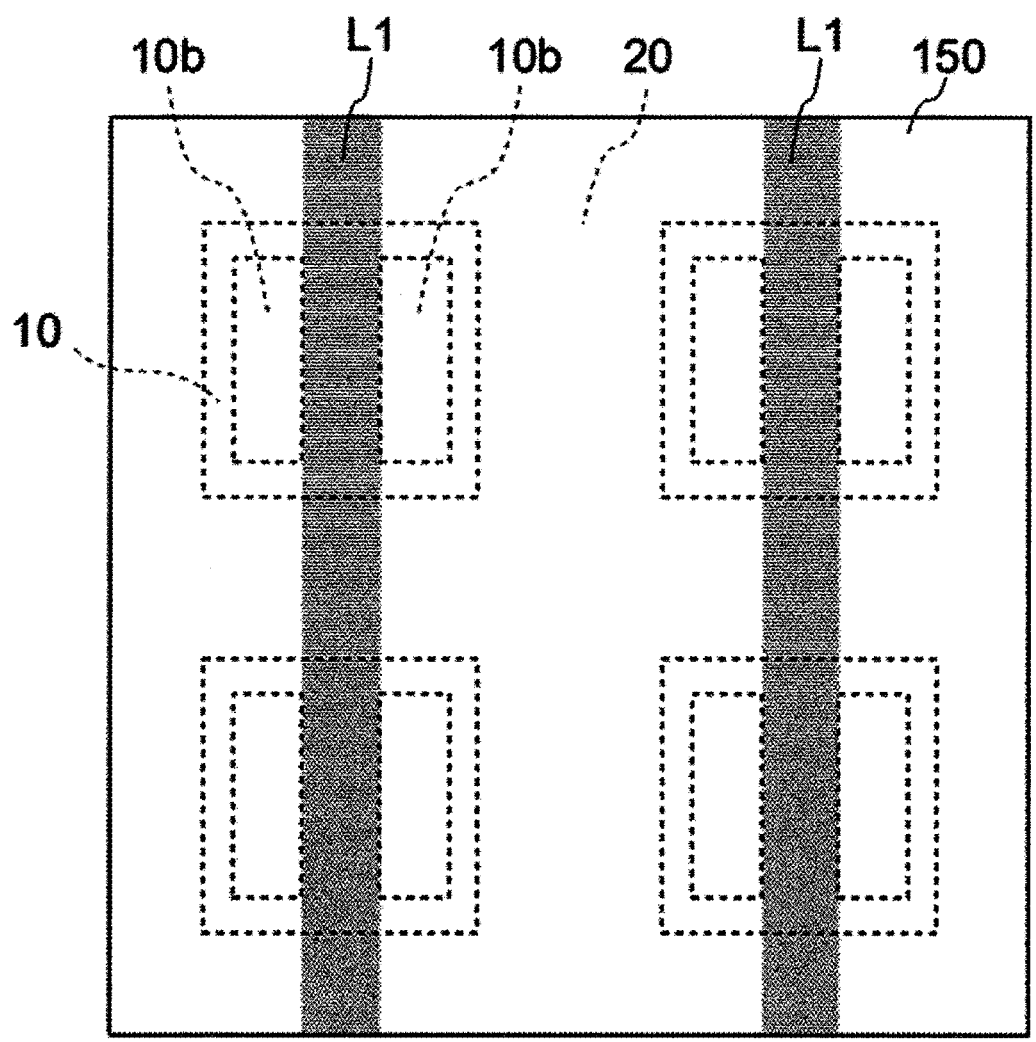
FIG. 3 is a schematic plan view illustrating the method of manufacturing the light emitting device according to the first embodiment.

As shown in FIG. 2C, the metal layer 150 is irradiated with laser light. More specifically, in FIG. 2C, a laser-light irradiation region L1 of the metal layer located between the plurality of electrodes of each of the light emitting elements 10 is irradiated with the laser light. FIG. 3 is a schematic plan view corresponding to FIG. 2C. In, FIG. 3, each of the laser-light irradiation regions (indicated by gray portions) L1 includes not only a region between the plurality of electrodes 10b of the light emitting element, but also a region above the covering member in an extending direction of the region between the plurality of electrodes 10b. Laser light can be irradiated continuously further to a region of the metal layer located between a plurality of electrodes of adjacent light emitting element. Arrangement of the light emitting elements 10 with regularity allows laser light to be easily applied continuously between the electrodes of the plurality of light emitting elements.

The laser-light irradiation region L1 has a width that is substantially the same width as that between the electrodes 10b of the light emitting element. Portions of the metal layer 150 located in the laser-light irradiation region L1 are removed by the laser ablation. In this manner, as illustrated in FIG. 2D, portions of the covering member 20 between the pair of electrodes 10b of the light emitting element are exposed.

Continuously or sequentially transferring an irradiation spot on a member allows the metal layer to be irradiated with laser light. The irradiation of the laser light may be continuous irradiation or pulse irradiation. The intensity of the laser light and the diameter and scanning speed of an irradiation spot can be selected in view of thermal conductivity of each of the covering member and metal layer and a difference in thermal conductivity between them so as to cause laser ablation in the metal layer on the covering member.

For the wavelength of the laser light, a wavelength that allows a low reflectance by the metal layer, more specifically, a wavelength that allows reflectance of 90% or less, is preferably selected. For instance, a laser light with an emission wavelength in a green region (e.g., around 550 nm), which is shorter than that in a red region (e.g., around 640 nm), is preferably used, in the case where the outermost surface of the metal layer is made of Au. With this arrangement, ablation can be efficiently occurred, so that the manufacturability of the light emitting device can be improved.

Figure 2D:
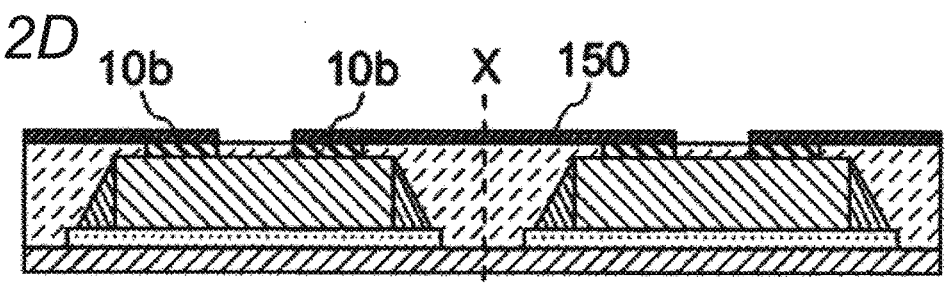

FIG. 4 is a schematic plan view corresponding to FIG. 2D. In the first embodiment, the intermediate member 11 including the plurality of light emitting elements 10 is used.

As shown in FIGS. 2D and 4, removing portions of the metal layer 150 by irradiating laser light allows the metal layer 150 to be separated between the pair of electrodes 10b in each of the light emitting elements 10. Meanwhile, the metal layer continuously covers electrodes of adjacent light emitting elements. That is, the metal layer 150 in this state does not function as the external connection electrode.

Figure 2E:
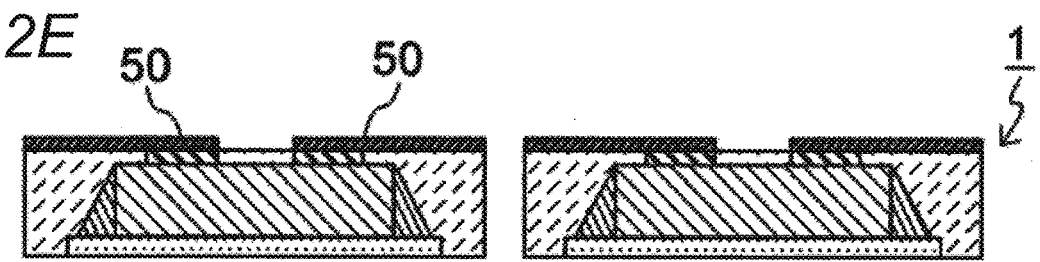

Such continuous metal layer 150 and covering member 20 are cut to be singulated between the adjacent light emitting elements (along a cutting line indicated by a dashed line X in FIG. 2D), and then the support member S1 is removed, so that the light emitting device 1 including the external connection electrodes 50 as shown in FIG. 2E can be obtained.

The obtained light emitting device 1 includes the metal layers 150 serving as the external connection electrodes 50. The external connection electrodes 50 are respectively connected to each of the plurality of electrodes 10b of the light emitting device.

Furthermore, each of the external connection electrodes 50 has an area larger than that of respective one of the plurality of electrodes 10b. Each of the external connection electrodes 50 obtained by cutting the metal layer 150 is formed to reach end portions of the bottom surface of the light emitting device 1, that is, to reach the lateral surfaces of the light emitting device 1. In this way, the external connection electrode 50 with the wider area can be obtained.

The external connection electrodes 50 each having an area larger than that of respective one of the electrodes 10b of the light emitting element allows for facilitating mounting of the light emitting device 1. With the manufacturing method in the first embodiment, such a light emitting device can be easily obtained.

First Variant Example

Figure 5A:
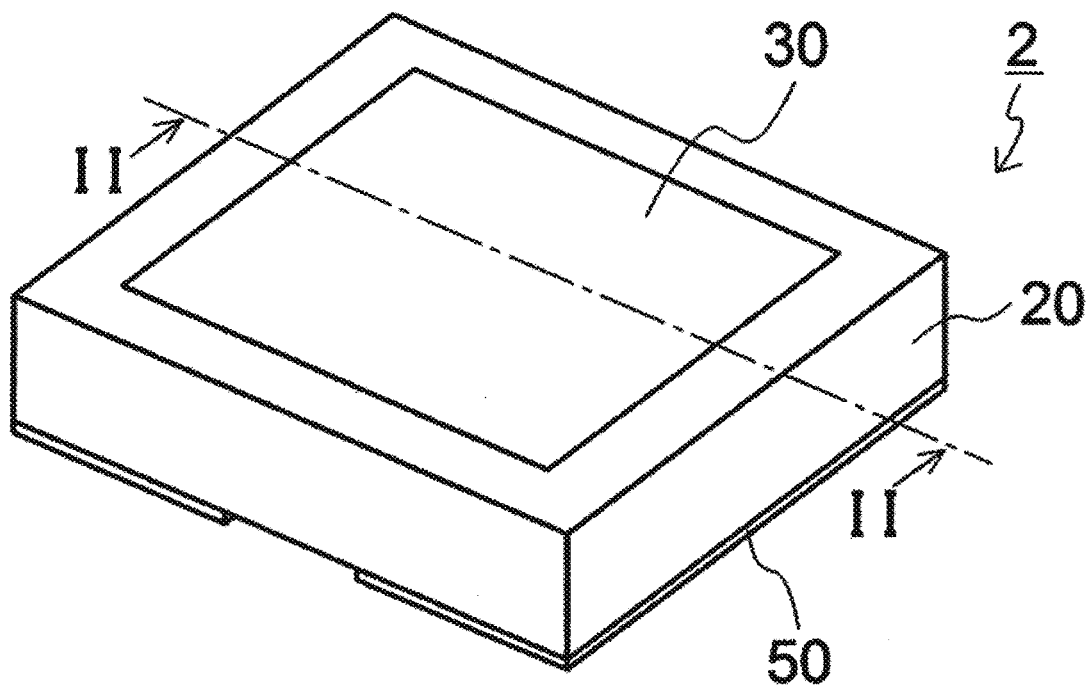
FIG. 5A is a schematic perspective view of a light emitting device according to a first variant example of the first embodiment when viewed obliquely from an upper side.
Figure 5B:
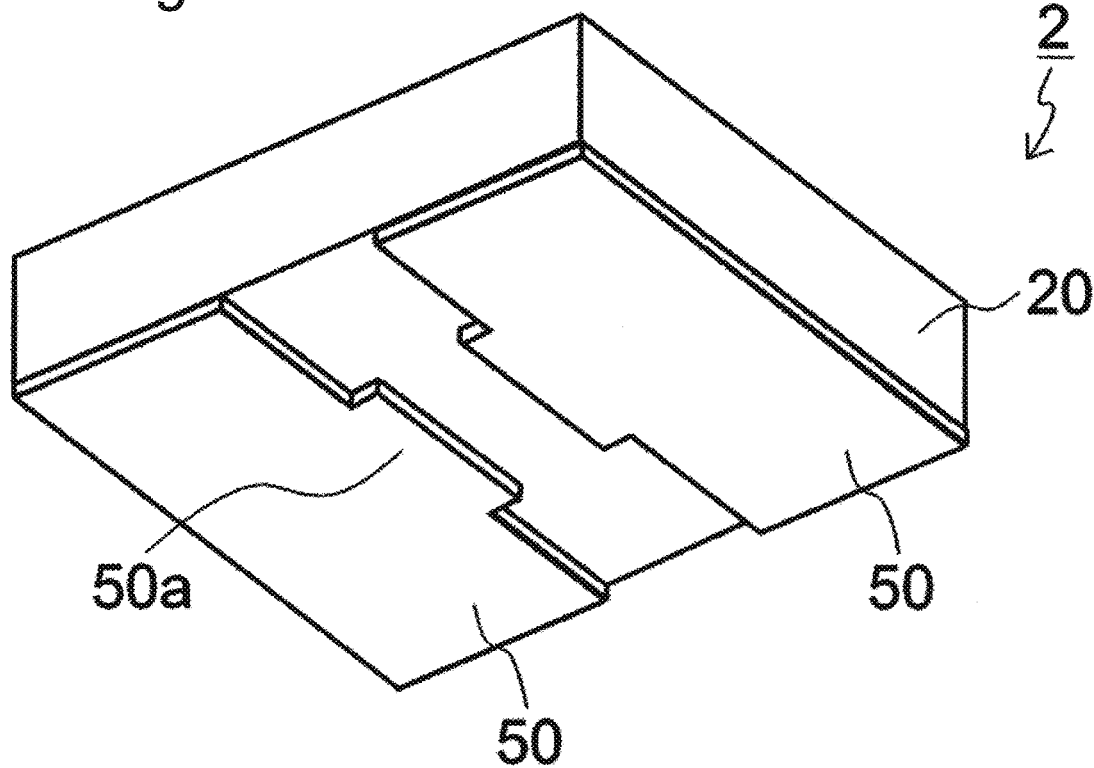
FIG. 5B is a schematic perspective view of the light emitting device according to the first variant example of the first embodiment when viewed obliquely from a lower side.

Shown in FIGS. 5A to 5C is a light emitting device 2 produced by a method of manufacturing a light emitting device according to a first variant example. In the first variant example, a step of irradiating a portion of the metal layer located over a region between the plurality of electrodes of the light emitting element with laser light is different from that in the first embodiment, but other steps are the same as those in the first embodiment. The first variant example differs from the first embodiment in the width of the laser-light irradiation region.

Specifically, in the first embodiment, the width of the laser-light irradiation region L1 is substantially the same as a distance between the electrodes 10b of the light emitting element as shown in FIG. 3.

Figure 6:
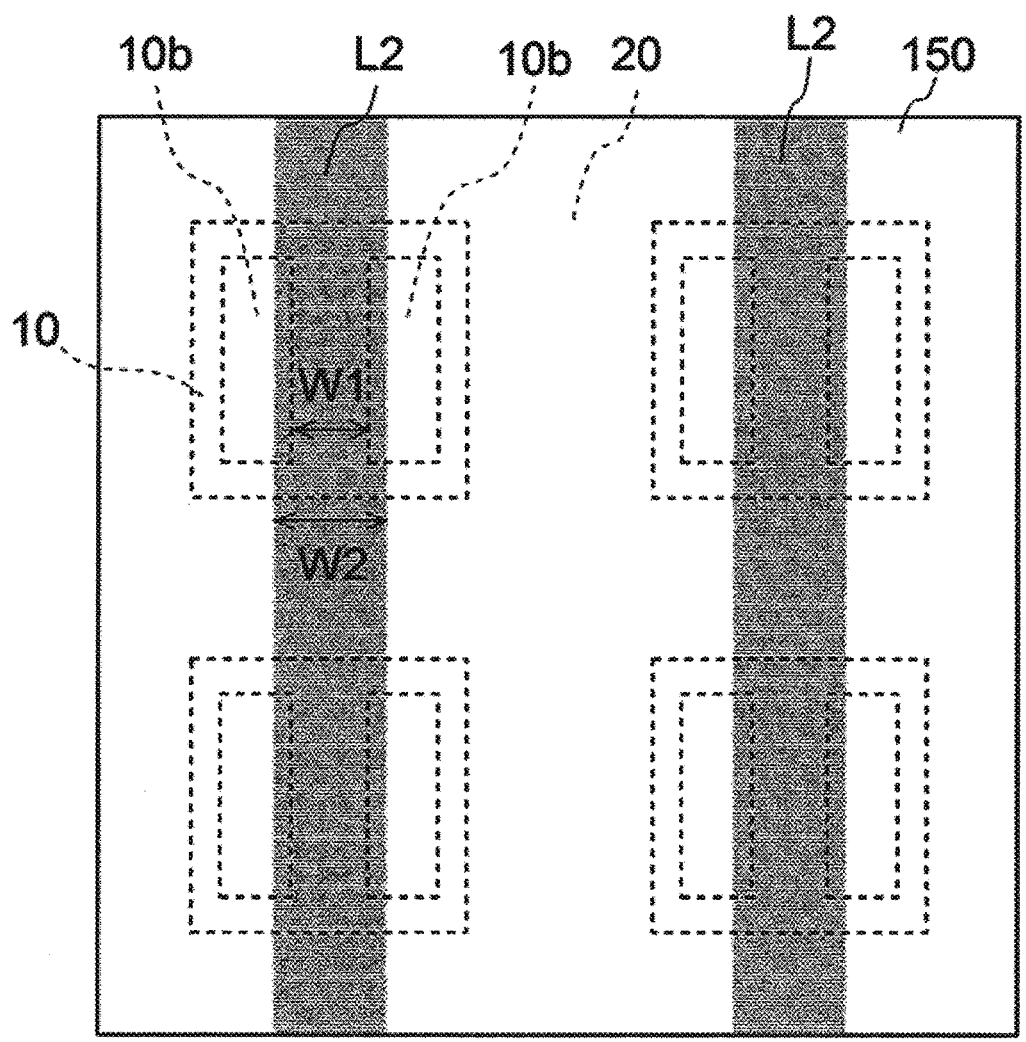
FIG. 6 is a schematic plan view illustrating the method of manufacturing the light emitting device according to the first variant example of the first embodiment.
Figure 7:
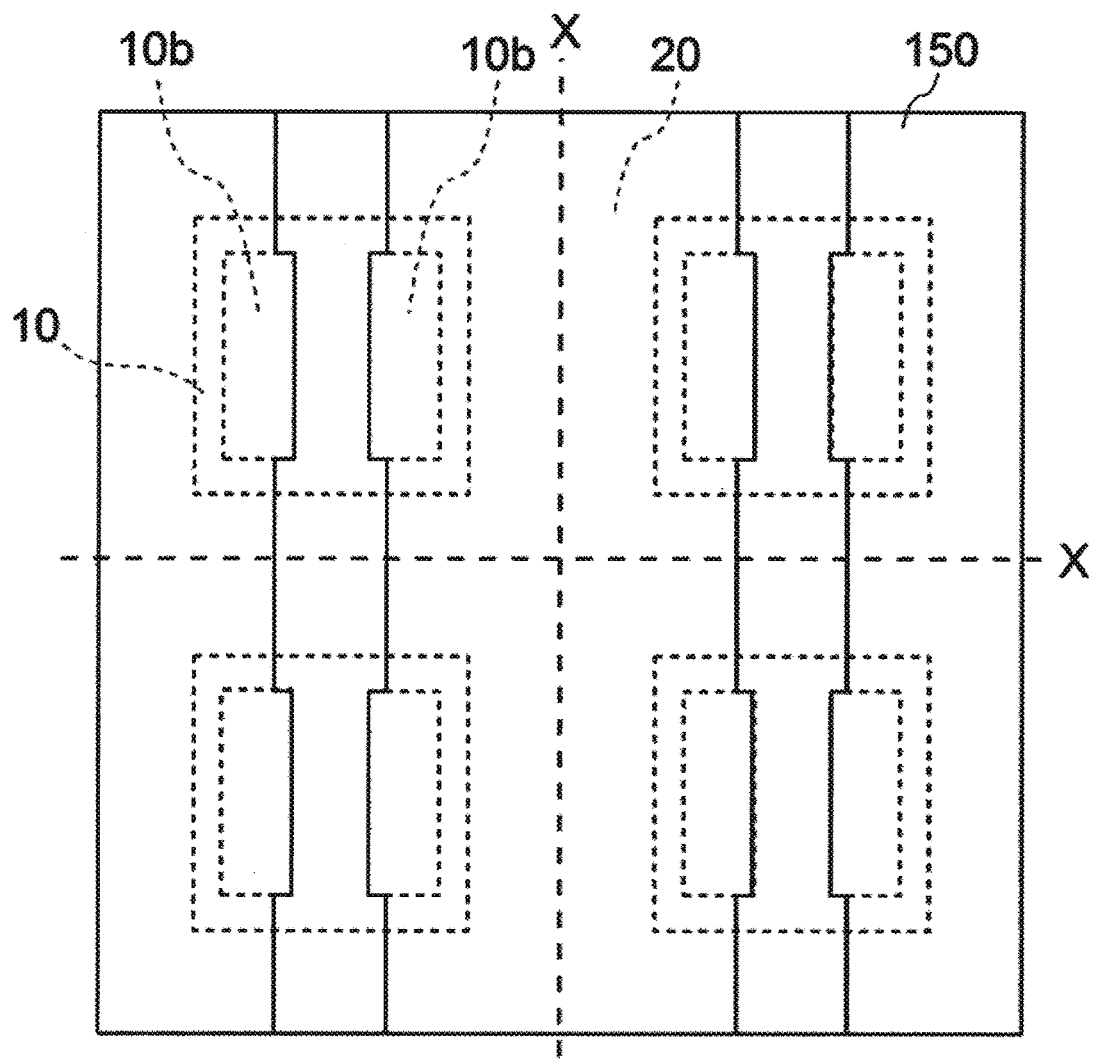
FIG. 7 is another schematic plan view illustrating the method of manufacturing the light emitting device according to the first variant example of the first embodiment.

On the other hand, in the first variant example shown in FIG. 6, a width W2 of a laser-light irradiation region L2 is wider than a distance W1 between the plurality of electrodes 10b of the light emitting element. As illustrated in FIG. 7, irradiation of such a region with the laser light allows for removing a part of the metal layer 150 that has a wider width than the distance between the electrodes 10b of the light emitting element, so that the covering member 20 can be exposed from the removed part.

As shown in FIG. 6, portions of the metal layer 150 located on the electrodes 10b of the light emitting element are also irradiated with laser light. However, in the portions of the metal layer 150 located on the electrodes 10b, laser ablation does not occur even if irradiated with laser light. This is because the covering member 20 and the electrode 10b of the light emitting element have different heat-dissipation properties. That is, the electrode 10b is made of a metal and has higher heat-dissipation properties, compared to the covering member 20 containing a resin as a main component. This is because a metal has high thermal conductivity and high thermal radiation properties. The output of a laser light for irradiation is selected to be in a range that allows for causing laser ablation in portions of the metal layer 150 located on the covering member 20 while not causing laser ablation in portions of the metal layer 150 located on the electrodes 10b.

This arrangement allows the laser light to remove portions of the metal layer 150 and not to remove other portions the metal layer 150 to remain and serve as external connection electrodes 50a. In other words, the laser-light irradiation region does not coincide with a removal region of the metal layer 150, so that the external connection electrodes 50a are formed in the laser-light irradiation region.

Figure 21:
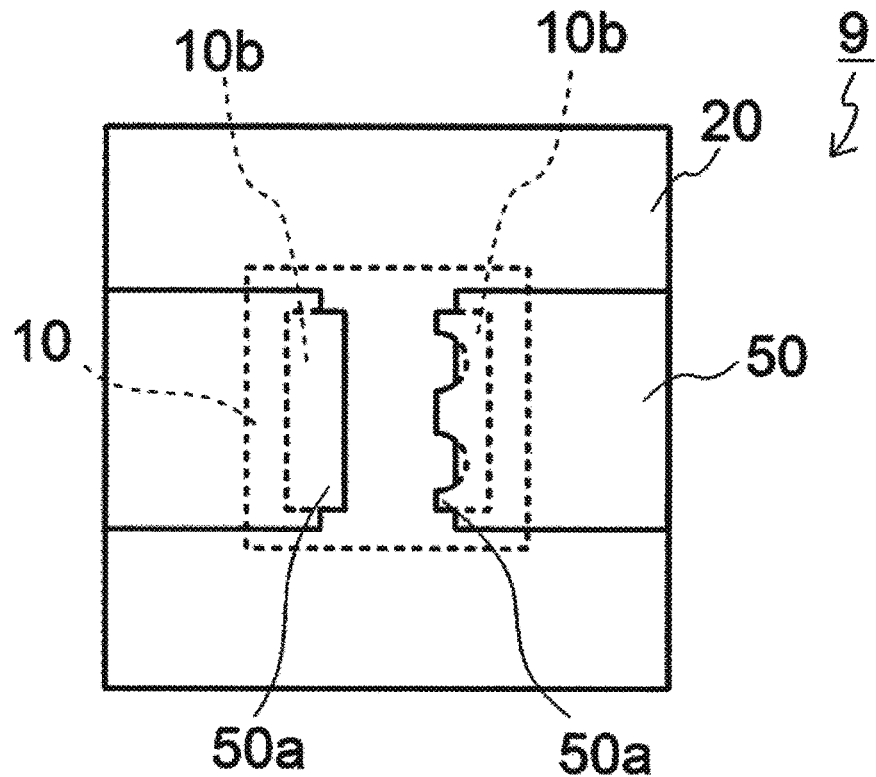
FIG. 21 is a schematic bottom view of the light emitting device according to the first variant example of the first embodiment.

Irradiating the laser light to the portions of the metal layer 150 located on the electrodes 10b of each of the light emitting elements to remove these portions as well as the portions of the metal layer 150 located on the covering member 20 allows for increasing a distance between the external connection electrodes 50 except for the portions located on the electrodes 10b of the light emitting element. For example, even in the case where the distance between the plurality of electrodes 10b of the light emitting element is small, the distance between the external connection electrodes 50 except for portions located on the electrodes 10b of the light emitting element can be increased. With this structure, the possibility of occurrence of a short-circuit due to spread of solder when mounting the light emitting device on a secondary substrate or the like can be reduced. As shown in FIG. 21, when electrodes 10b of a light emitting element 10 have different shapes, in particular, when the electrodes 10b of the light emitting element have different shapes at portions facing each other, irradiating regions including these differently-shaped portions with laser light can form the external connection electrodes 50 into different shapes. For example, as illustrated in FIG. 21, in the case where the electrodes 10b of the light emitting element include an electrode 10b on the left side having a rectangular shape and an electrode 10b on the right side having a shape with two recesses in a plan view, irradiating a region including a portion or an entirety of the recessed parts with the laser light allows the external connection electrodes 50a to have a shape similar to those of the electrodes 10b of the light emitting element. With this configuration, the polarities of the electrodes can be easily identified.

Figure 22:
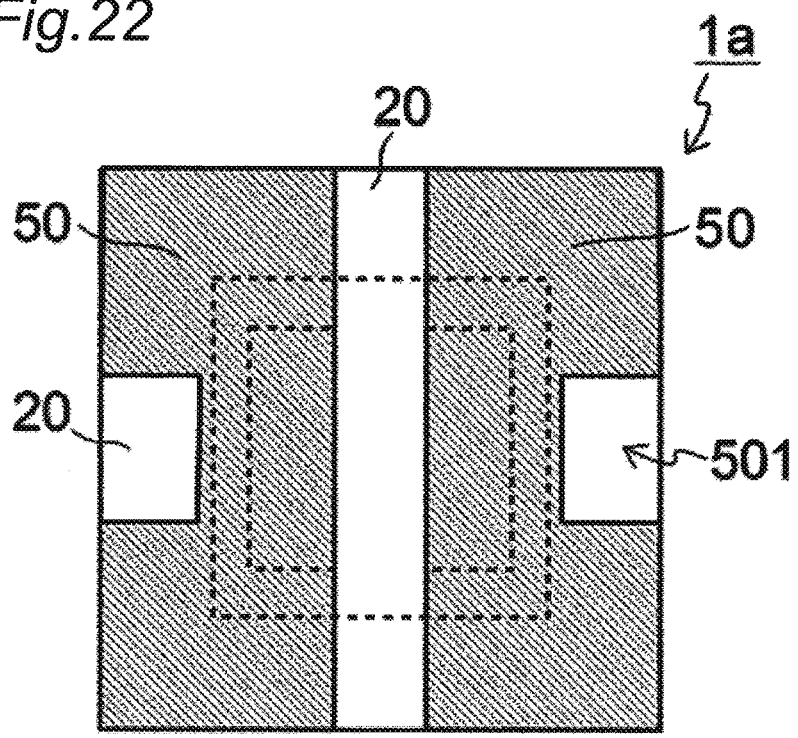
FIG. 22 is a schematic bottom view of the light emitting device according to the first variant example of the first embodiment.

Alternatively, as indicated by gray portions in FIG. 22, the external connection electrode may include a recess 501 in the outer periphery of the lower surface of the light emitting device 1a at a portion on an outer lateral surface side. For example, in the lower surface of the light emitting device 1a, the recess 501 is provided in peripheries at each of which one external connection electrode is disposed. Specifically, in the light emitting device 1a shown in FIG. 22, two external connection electrodes 50 are arranged laterally on the left and right sides. Further, the recess 501 is provided at a right periphery of the external connection electrode 50 on the right side. Similarly, another recess 501 is provided at a left periphery of the external connection electrode 50 on the left side.

In these recesses 501 of the external connection electrodes 50, the covering member 20 is exposed, similarly to a region between the two external connection electrodes 50. Thus, in the lower surface of the light emitting device 1a shown in FIG. 22, one portion of covering member 20 continuously extending between the upper periphery to the lower periphery at a center region and two portions of the covering members 20 contact with the right periphery and left periphery, respectively, are exposed.

With such recesses 501 in portions of the external connection electrodes 50, the area of the external connection electrode to be in contact with a solder or the like can be decreased by the area of the recess. Furthermore, with the recesses on the outer lateral surface side of the light emitting device, the length of the external connection electrode arranged closer to the respective outer lateral surface can be shortened. That is, with the recess, a portion of the outer periphery of each of the external connection electrodes can be arranged spaced away from the corresponding outer lateral surface of the light emitting device. With this shape, when the light emitting device is mounted on a secondary substrate with a solder or the like, gas generated directly under the light emitting element 10 can be easily discharged to the outside. Accordingly, generation of voids can be suppressed. The light emitting device and the secondary substrate have different thermal expansion rates, which may cause breakage of the light emitting device due to the thermal shock or the temperature cycle. However, the recesses provided in a portion of each of the external connection electrodes 50 allows for decreasing the area of each of the external connection electrodes bonded to the substrate via a solder, which can decrease the stress applied to the bonded parts, so that breakage of the light emitting device can be prevented.

Furthermore, such recesses 501 provided in the parts of the external connection electrodes 50 allows for reducing the size of portions of the metal film to be cut in singulation. With this, cutting can be facilitated. Such recesses 501 can be formed by irradiating portions of the metal film with the laser light to cause laser ablation and thus removing the metal film in these portions.

The size, position, shape, etc. of the recess 501 of the external connection electrode 50 may be appropriately selected. For example, in FIG. 22, one recess 501 is defined in a rectangular shape in the external connection electrode 50. The number of recesses 501 defined in each external connection electrode 50 may be plural, that is, two or more. The recess 501 can be defined with a polygonal shape, such as a triangular shape, a circular shape, an elliptical shape, or a combination thereof. Referring to FIG. 22, the recesses 501 are each disposed at the center in the vertical direction of FIG. 22. That is, each of the recesses is defined at the center of one periphery of the light emitting device. The recesses may be defined in positions offset from the center of the periphery of the light emitting device. The recesses can be defined at either or both of the two external connection electrodes. Preferably, the recesses 501 are respectively formed symmetrically on the left and right sides with the same size and shape.

Such recesses defined from the outer periphery of the external connection electrode can also be provided in other embodiments.

Second Embodiment

Figure 8A:
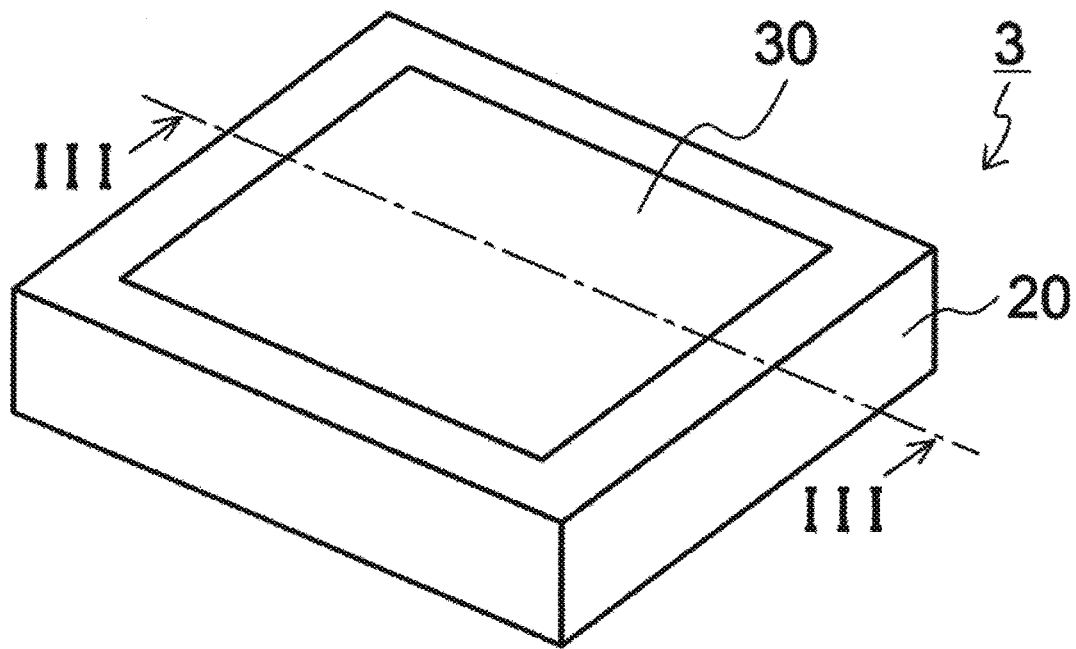
FIG. 8A is a schematic perspective view of a light emitting device according to a second embodiment when viewed obliquely from an upper side.
Figure 8B:
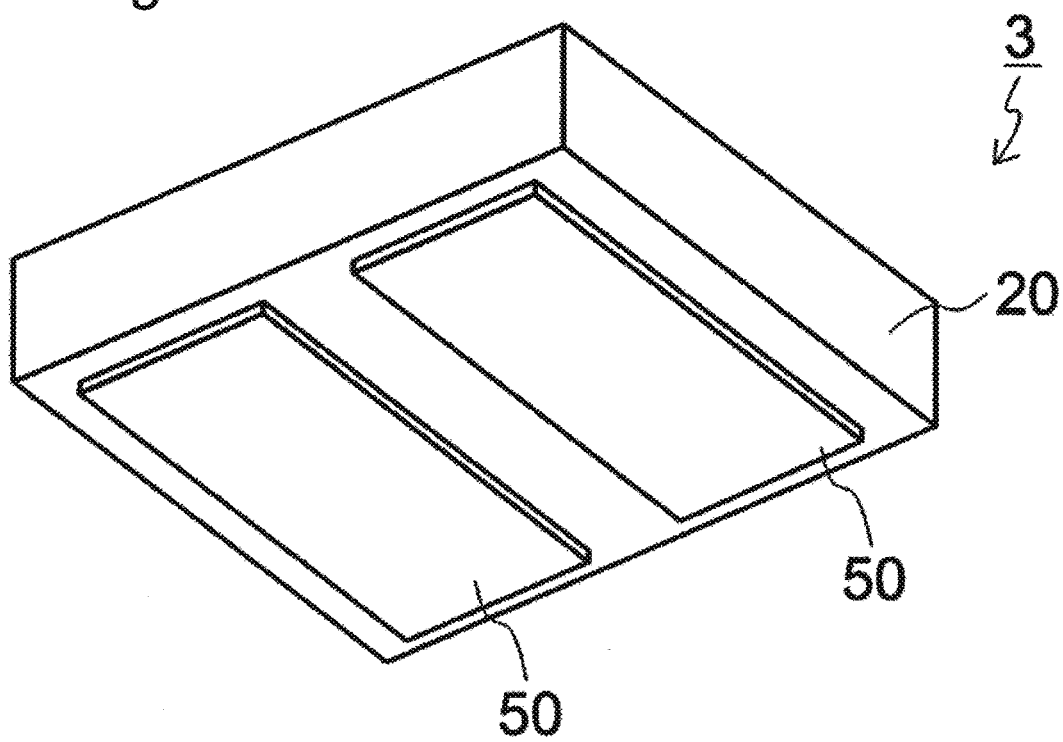
FIG. 8B is a schematic perspective view of the light emitting device according to the second embodiment when viewed obliquely from a lower side.

In FIGS. 8A to 8C, a light emitting device 3 produced by a method of manufacturing a light emitting device according to a second embodiment is shown. In FIGS. 9A to 11, a method of manufacturing the light emitting device in the second embodiment is illustrated. In the second embodiment, steps up to the step of the forming the metal layer is the same as that in the first embodiment, but a step of forming external connection electrodes is different from that in the first embodiment. Specifically, the laser-light irradiation region includes a region between the electrodes 10b of each light emitting element and a region to be cut for obtaining an individual light emitting device. That is, simply by the irradiation with the laser light, the individual external connection electrodes can be obtained from the metal layer. Thus, the external connection electrodes can be formed without cutting the metal layer in a subsequent step.

The light emitting device 3 obtained through the manufacturing method of the second embodiment differs from the light emitting device 1 in that the external connection electrodes 50 are spaced apart from the respective lateral surfaces of the light emitting device 3.

In the first embodiment, the laser light is irradiated to a portion of the metal layer 150 located over a portion between the electrodes 10b of each of the light emitting elements and a portion of the metal layer 150 on the covering member 20 at portions in the extension of a portion between the electrodes 10b. That is, in the light emitting device 1 obtained through the method in the first embodiment, as shown in FIG. 1B, the covering member 20 is exposed in one strip region passing through the center of each of the light emitting devices 1 at its lower surface. In contrast, as shown in FIG. 8B, in the light emitting device 3 obtained in the second embodiment, the covering member 20 is exposed not only in one strip region passing through the center of the lower surface of the light emitting device 3, but also at the outer periphery of the lower surface thereof is removed.

Figure 9A:
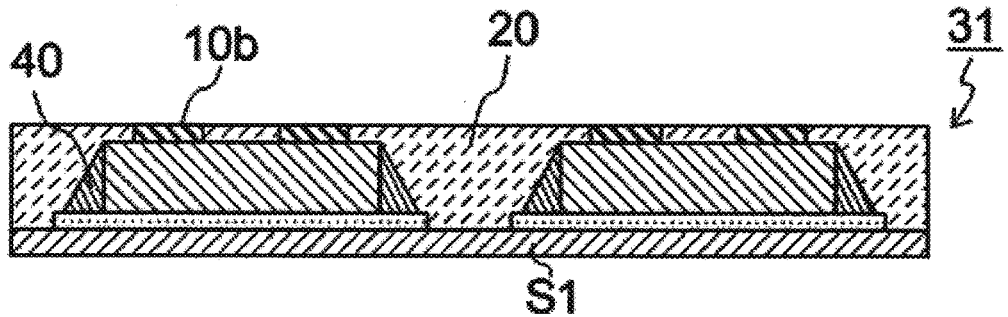
FIGS. 9A to 9E are schematic cross-sectional views illustrating a method of manufacturing the light emitting device according to the second embodiment.
Figure 9B:
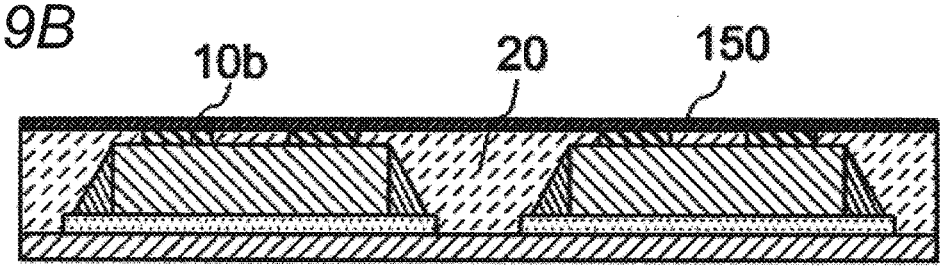
Figure 9C:
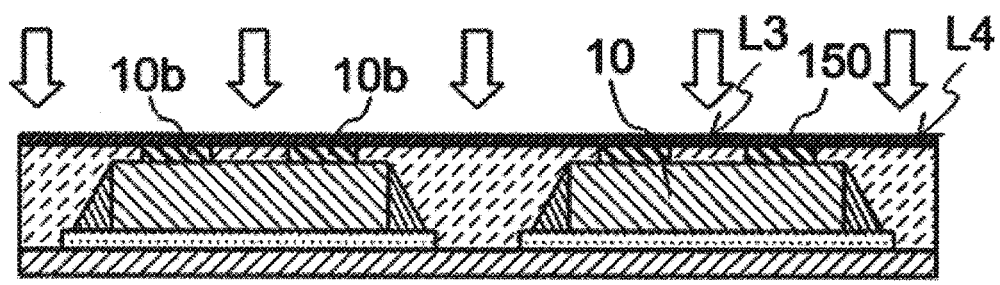
Figure 9D:
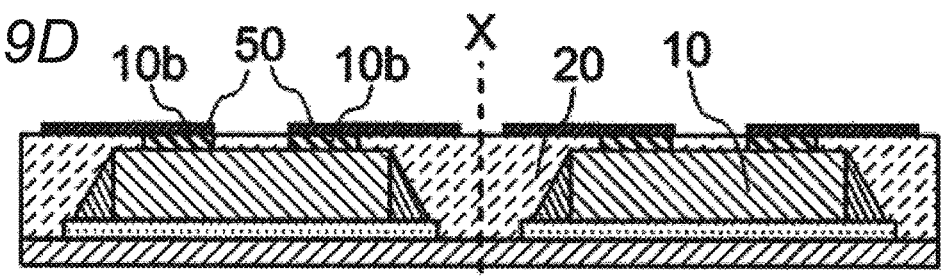
Figure 9E:
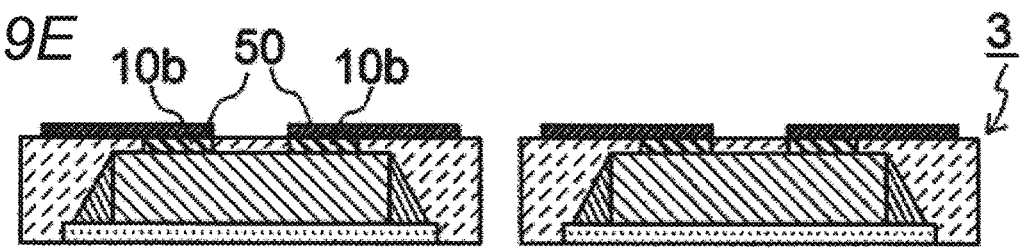
Figure 10:
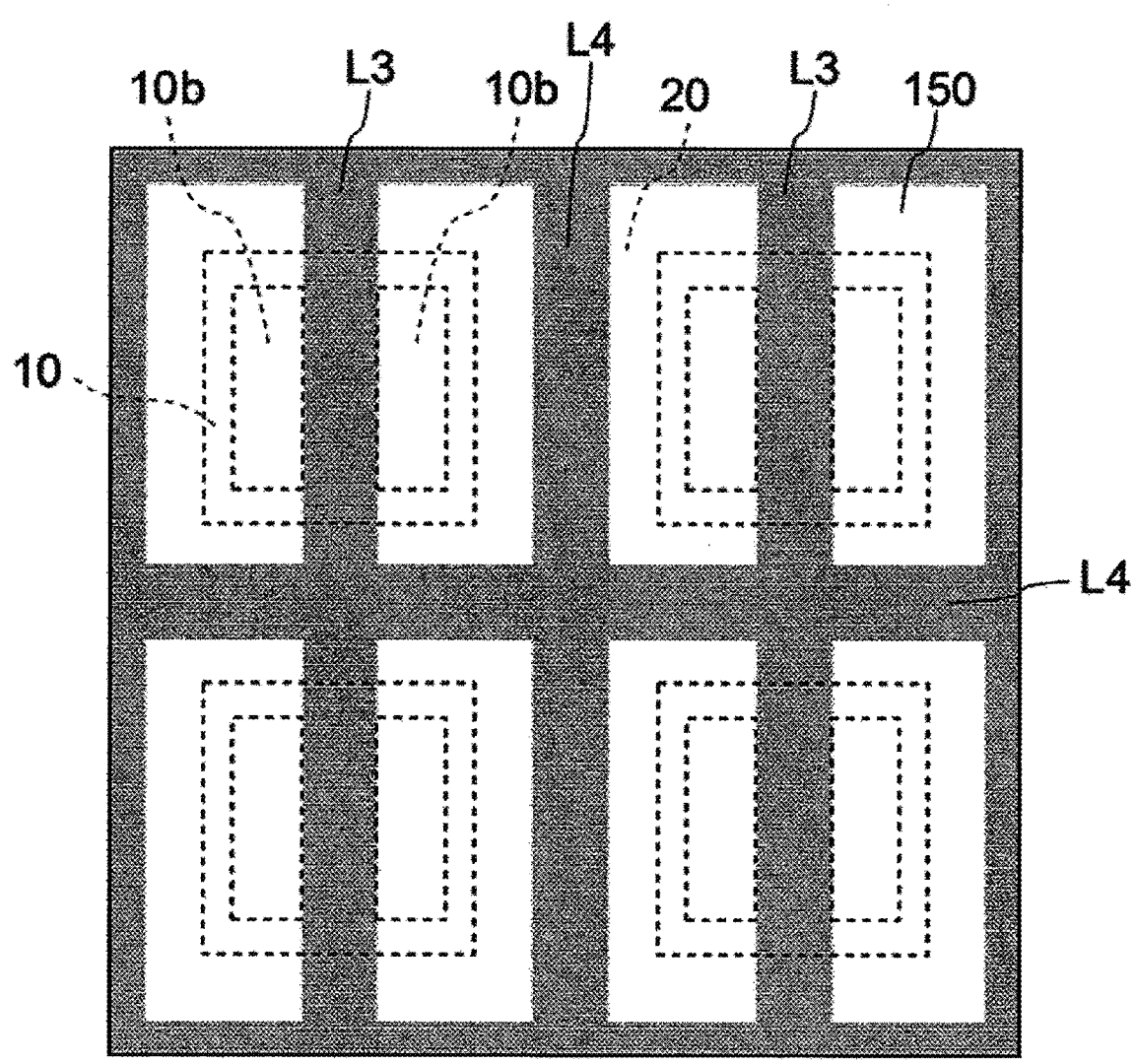
FIG. 10 is a schematic plan view illustrating the method of manufacturing the light emitting device according to the second embodiment.

Such a light emitting device 3 can be obtained by the manufacturing method shown in FIGS. 9A to 9E. For an intermediate member 31 prepared as shown in FIG. 9A and the metal layer 150 shown in FIG. 9B, materials similar to those in the first embodiment can be used. Then, as shown in FIG. 9C, a portion of the metal layer 150 located on the covering member 20 between the electrodes 10b of each of the light emitting elements and a portion of the metal layer 150 located on the covering member 20 at a region between the adjacent light emitting elements are irradiated with laser light. FIG. 10 is a plan view corresponding to FIG. 9C. Laser-light irradiation regions L3 and laser-light irradiation regions L4 are irradiated with the laser light. Each of the laser-light irradiation regions L3 includes a portion of the metal layer 150 over a region between the electrodes 10b of each of the light emitting elements 10. Each of the laser-light irradiation regions L4 includes a portion of the metal layer over a region between adjacent light emitting elements 10.

Figure 11:
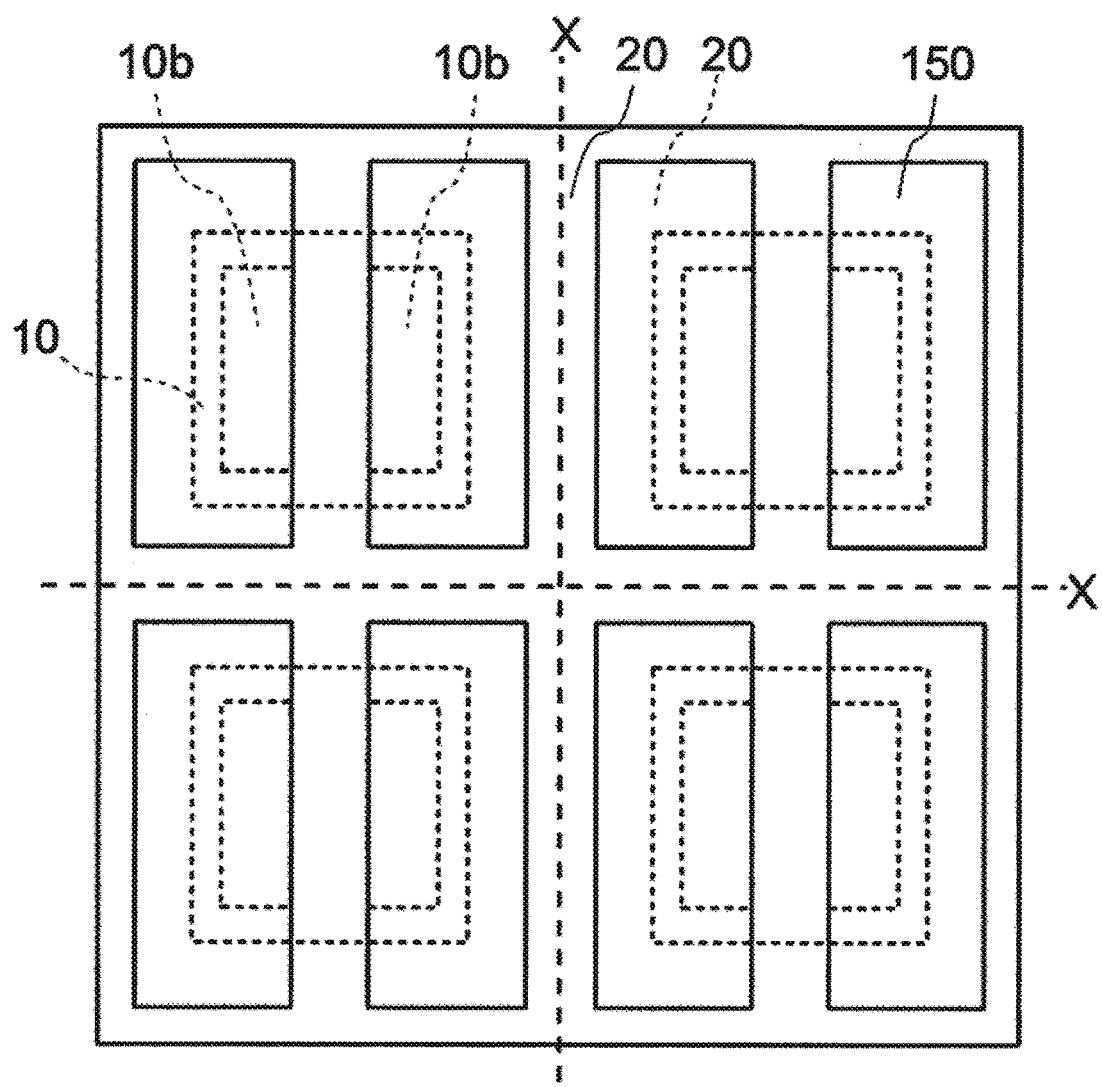
FIG. 11 is another schematic plan view illustrating the method of manufacturing the light emitting device according to the second embodiment.

The portions of covering member 20 between adjacent light emitting elements 10 are to be cut in in a later singulation step. In the second embodiment, the portion of the metal layer 150 located on the covering member 20 in a position to be cut is removed by laser ablation in advance, which can divide the metal layer 150 to be spaced apart from each other at portions between adjacent light emitting elements as illustrated in FIG. 11. That is, at this time, the divided metal layers serve as the external connection electrodes. In this manner, dividing the metal layer to be the external connection electrodes allows a portion of the covering member 20 to be present on the cutting line X. Thus, in the singulation, as shown in FIG. 9D, only the covering member 20 is cut. With this arrangement, cutting can be easily performed compared with the case of cutting both the metal layer and the covering member at the same time. Accordingly, the light emitting device 3 singulated as shown in FIG. 9E can be obtained. Also in the second embodiment and subsequent embodiments, similarly to the variant example of the first embodiment, the laser-light irradiation region can have a width greater than the distance between the electrodes 10b of each of the light emitting elements.

Third Embodiment

Figure 12A:
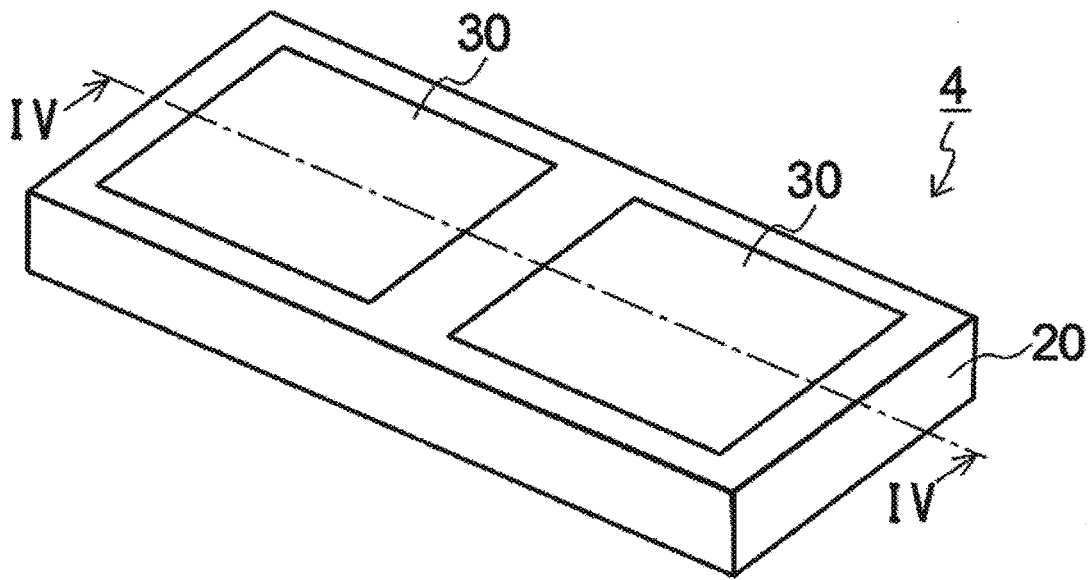
FIG. 12A is a schematic perspective view of a light emitting device according to a third embodiment when viewed obliquely from an upper side.
Figure 12B:
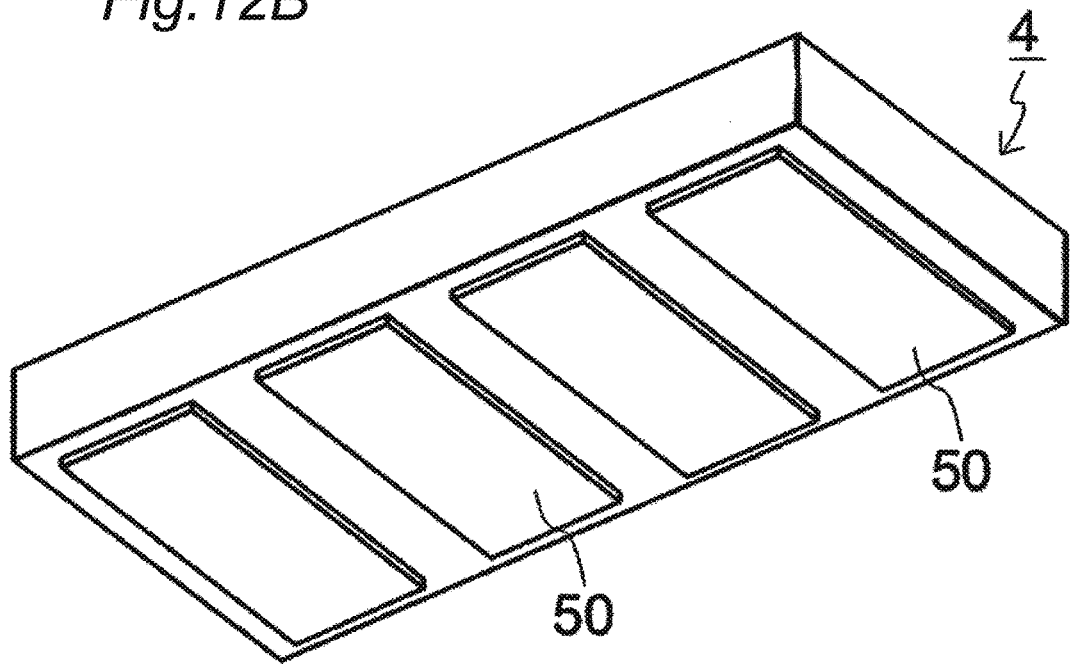
FIG. 12B is a schematic perspective view of the light emitting device according to the third embodiment when viewed obliquely from a lower side.
Figure 12C:
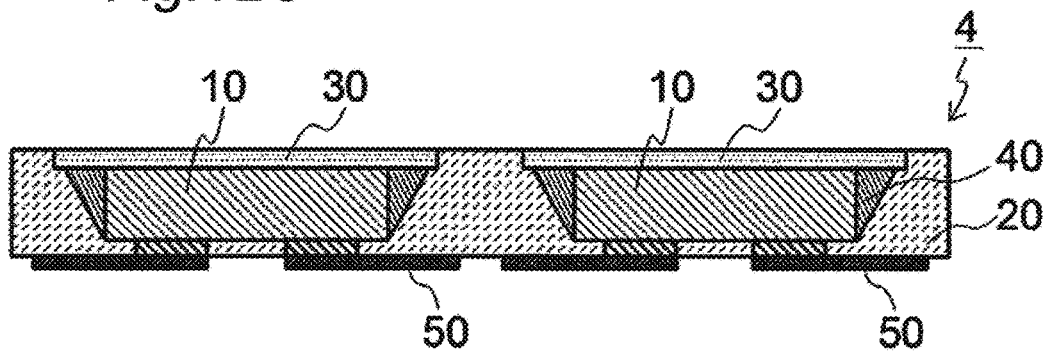
FIG. 12C is a schematic cross-sectional view taken along the line IV-IV of FIG. 12A.

In FIGS. 12A to 12C, a light emitting device 4 produced by a method of manufacturing a light emitting device according to a third embodiment is shown. In the third embodiment, steps up to the step of forming the metal layer 150 are the same as those in the second embodiment.

Furthermore, the third embodiment is the same as the second embodiment in irradiating a portion of the metal layer 150 over a region between the electrode of each of the light emitting elements and a portion of the metal layer 150 over a region between adjacent light emitting elements with the laser light. However, in the second embodiment, the portion of the metal layer removed by the irradiation with the laser light is a portion to be divided into individual light emitting device.

On the other hand, in the third embodiment, a portion of the metal layer located over a region between the light emitting elements at which division is not to be performed is also removed by irradiation with the laser light.

As shown in FIGS. 12A and 12B, the light emitting device 4 includes two light emitting elements 10. Further, the light emitting device 4 includes a pair of individual external connection electrodes 50 so that the light emitting elements 10 can be independently driven. That is, the light emitting device 4 includes two pairs of external connection electrodes 50.

Such a light emitting device 4 can be manufactured in the same method as shown in the second embodiment until the step of irradiating laser light. At the time of cutting the covering member 20 for singulation, the covering member 20 is cut at a position that allows a singulated light emitting device to include two pairs of external connection electrodes, which are formed to be independent from each other, in other words, so that at a position that allows the singulated light emitting device to include two light emitting elements, so that the light emitting device 4 can be obtained. Alternatively, cutting can be performed so that the singulated light emitting device includes three or more light emitting elements. Also in the second embodiment, similarly to the variant example of the first embodiment, the laser-light irradiation region can have a width greater than the distance between the electrodes 10b of each of the light emitting element.

The light emitting device can include two or more light emitting elements 10 configured to be driven independently as in the third embodiment.

Figure 13:
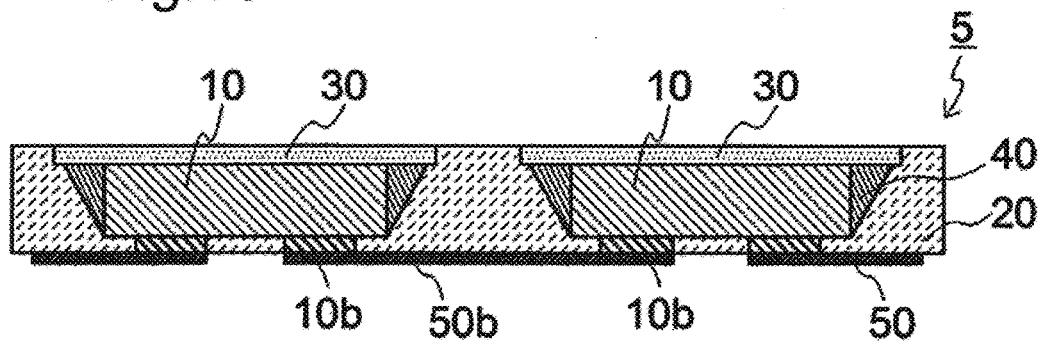
FIG. 13 is a schematic cross-sectional view illustrating a method of manufacturing the light emitting device according to the third embodiment.

Alternatively, as shown in FIG. 13, a light emitting device 5 can have a structure in which two light emitting elements 10 are connected in series. That is, the light emitting device 5 can be configured so that one electrode 10b of each of the two light emitting elements 10 is connected to a respective one of external connection electrodes 50. In FIG. 13, of the two light emitting elements 10, an external connection electrode 50b is provided over a right-side electrode 10b on a lower surface of a left-side light emitting element 10 and a left-side electrode 10b on the lower surface of a right-side light emitting element 10 in a bridged manner. In such a light emitting device 5, in the manufacturing step illustrated in FIG. 13, preventing a portion of the metal layer on the covering member between the light emitting elements from being irradiated with the laser light allows for forming the external connection electrode 50b that continuously connects an electrode 10b of each of the two light emitting elements.

Fourth Embodiment

Figure 14A:
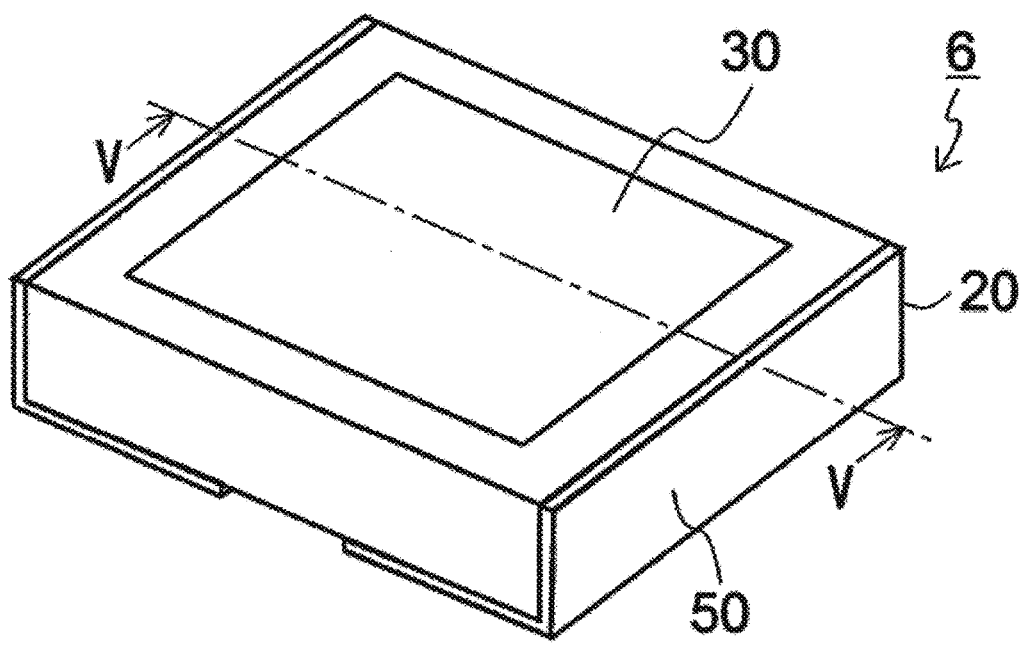
FIG. 14A is a schematic perspective view of a light emitting device according to a fourth embodiment when viewed obliquely from an upper side.
Figure 14B:
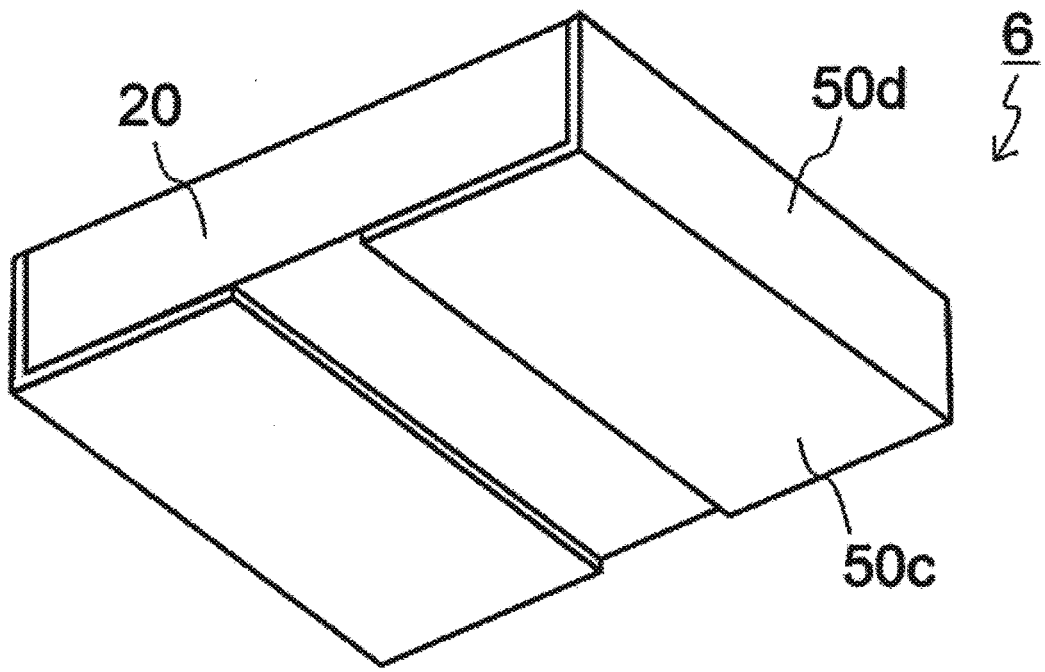
FIG. 14B is a schematic perspective view of the light emitting device according to the fourth embodiment when viewed obliquely from a lower side.
Figure 14C:
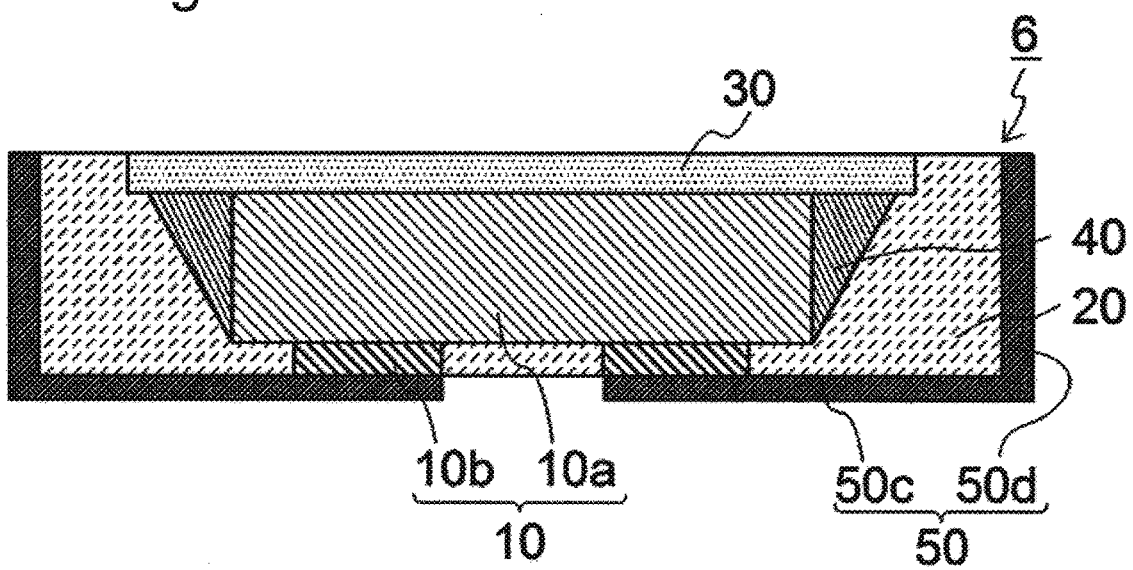
FIG. 14C is a schematic cross-sectional view taken along the line V-V of FIG. 14A.

In FIGS. 14A to 14C, a light emitting device 6 manufactured by a method of manufacturing a light emitting device according to a fourth embodiment. In FIGS. 15A to 15E, the method of manufacturing the light emitting device in the fourth embodiment is illustrated. The light emitting device 6 includes the external connection electrodes 50, each of which includes an external connection portion 50c at the lower surface of the light emitting device 6, and an external connection portion 50d on the lateral surface of the light emitting device 6, which is the cut surface. The external connection portions 50c and 50d are continuous with each other.

Figure 15A:
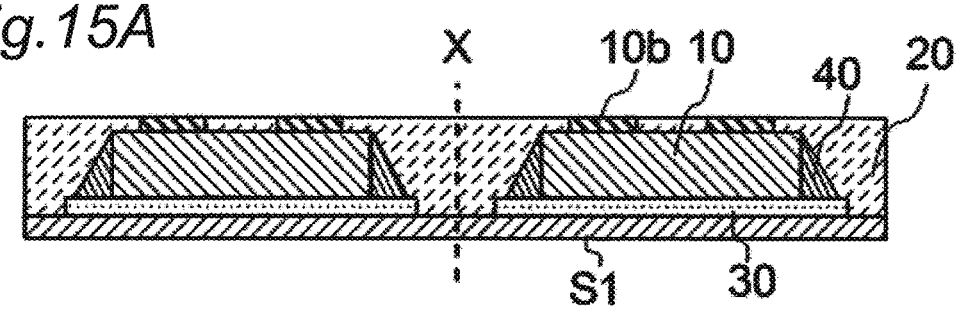
FIGS. 15A to 15E are schematic cross-sectional views illustrating a method of manufacturing an intermediate member according to the fourth embodiment.
Figure 15B:
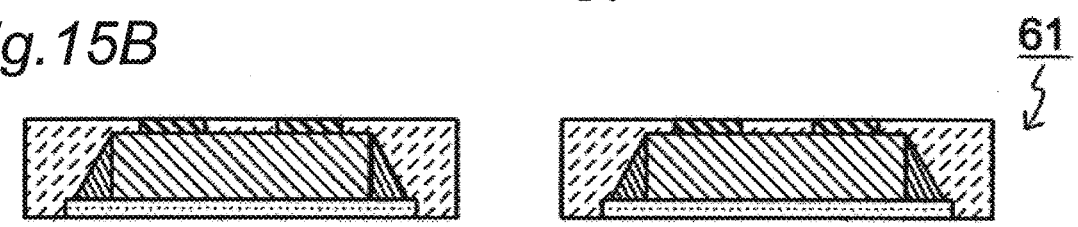

In the fourth embodiment, an intermediate member is used in which a covering member has been cut and cut surfaces of the covering member are exposed. The cut surfaces may be surfaces exposed by cutting the covering member in all positions to be cut, or alternatively surfaces exposed by cutting the covering member in a portion of each of the positions to be cut. As shown in FIG. 15A, an intermediate member including a plurality of light emitting elements 10 placed on the support member S1, the covering member 20 is cut before forming a metal layer. Thus, as shown in FIG. 15B, a plurality of intermediate members 61 each including one light emitting element is formed. The obtained intermediate members 61 are disposed on a support member S2 so as to be spaced apart from each other.

Figure 15C:
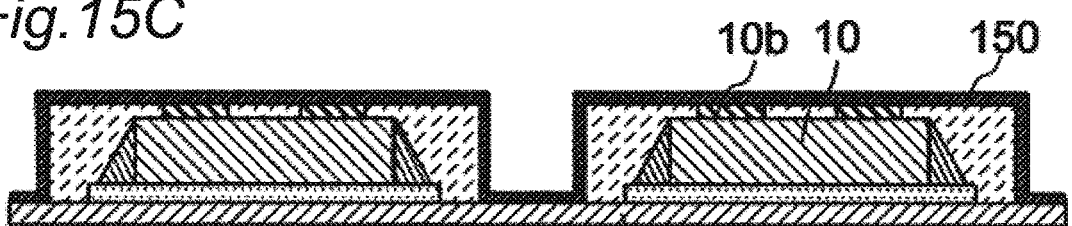

Next, the metal layer 150 is formed over the plurality of intermediate members 61 on the support member S2. As illustrated in FIG. 15C, the metal layer 150 is continuously formed over the lateral surfaces of the covering members 20 and over the support member S2, as well as over the plurality of electrodes 10b and upper surfaces of the covering members 20 (i.e., electrode formation surfaces). Examples of the method for forming the metal layer on the lateral surfaces of the covering member 20 in this way include CVD method, ALD method, a sputtering method, and a vapor deposition method.

Figure 15D:
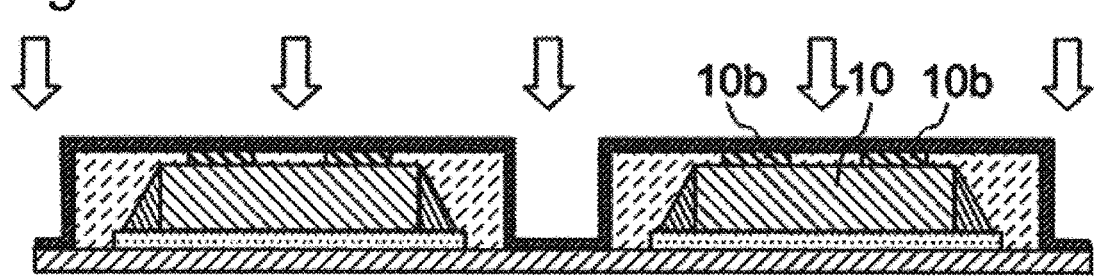
Figure 15E:
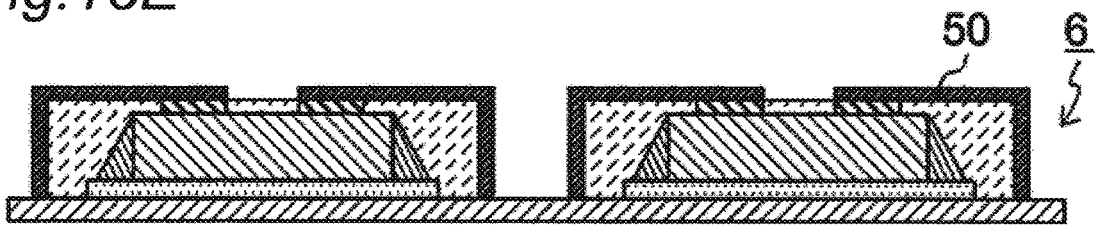

Then, as shown in FIG. 15D, a portion of the metal layer 150 located over a region between the pair of electrodes 10b and a portion of the metal layer 150 located over the support member S2 are irradiated with laser light. That is, the portion of the metal layer 150 in the regions to be removed is irradiated with the laser light. Thus, as shown in FIG. 15E, the external connection electrodes 50 each connected to respective one of the plurality of electrodes 10b in the light emitting element 10.

In the case in which light emitting elements are arranged in row and column, for example, an intermediate member can also be cut in a row direction while not cut in a column direction. The light emitting device 6 shown in FIG. 14B has a rectangular shape in a plan view and has four lateral surfaces. The intermediate member 61 includes a pair of lateral surfaces on which the external connection portions 50d are disposed and a pair of lateral surfaces on which the external connection electrodes are not disposed.

As shown in FIG. 15C, the pair of lateral surfaces having the external connection electrodes 50d are the surfaces that are cut before forming the metal layer 150 that is configured to serve as the external connection electrodes 50d. Meanwhile, the lateral surfaces on which the external connection electrodes are not disposed are surfaces that are cut after forming the metal layer 150. As described above, the intermediate member is obtained before forming the metal layer 150, by cutting at certain predetermined positions (for example, in a row direction) so that the covering member is kept in a continuous state at the rest of the predetermined positions. Then, the metal layer 150 is formed, and cutting is carried out at the rest of the predetermined positions (for example, in a column direction) having the continuous covering member. Thus, the external connection electrodes 50d can be formed only on one pair of opposed lateral surfaces.

The intermediate member may be obtained by creating cut surfaces in both the row and column directions. External connection electrodes may be formed using such an intermediate member. In that case, a portion of the metal layer located between the electrodes 10b of the light emitting element is removed by laser irradiation to divide the external connection electrodes into positive and negative electrodes, thereby exposing the covering member 20.

Then, the laser irradiation is subsequently performed also on the lateral surfaces of the covering member, so that the respective parts of the metal layer are removed. Also in the fourth embodiment, similarly to the variant example of the first embodiment, a laser-light irradiation region can have a width greater than the distance between the electrodes 10b of the light emitting element.

For the support member S2, a material same as the material used for the support member S1 used in the cutting of the intermediate member may be used, or a material different from that may be used. Unlike other embodiments, the metal layer is formed on a surface of the support member S2 in the fourth embodiment.

The material for the support member S2 can be selected in accordance with a method of removing the metal layer on the support member S2. For example, when removing the metal layer on the support member through laser ablation by irradiation with the laser light in the same manner as the removal of the metal layer on the covering member 20, similarly to the removal of the covering member 20, a material having lower heat-dissipation properties than a metal can be used. Examples of such a material for the support member preferably include a resin material similar to the material employed for the covering member 20, polyimide, polyethylene terephthalate (PET), polyethylene naphthalate (PEN), and polyethersulfone (PES). The laser irradiation may not be performed in the case where the metal layer 150 is mechanically cut between a portion on the support member S2 and a portion on the lateral surfaces of the light emitting device 6 at the time of removing the light emitting device 6 from the support member S2. In that case, the above-described resin member or a metal member can be used for the support member S2. Also in the fourth embodiment, similarly to the variant example of the first embodiment, a laser-light irradiation region can have a width greater than the distance between the electrodes 10b of the light emitting element.

The components used in each embodiment will be described below.

Intermediate Member

The intermediate member includes the light emitting element and the covering member. The intermediate member can further include a light-transmissive member or the like.

Intermediate Member 11

A method of forming the intermediate member 11 used in manufacturing of the light emitting device 1 shown in FIG. 1 is illustrated in FIGS. 16A to 16E. Variant examples of the intermediate member are shown in FIGS. 17 and 19, and methods of manufacturing thereof are illustrated in FIGS. 18A to 18E and FIGS. 20A and 20B, respectively.

FIGS. 16A to 16E are diagrams illustrating the method of manufacturing the intermediate member 11 used in the light emitting device 1 shown in FIG. 1 in which the intermediate member includes the light emitting elements 10, the covering member 20, the first light-transmissive member 30 including a wavelength-conversion member, and a second light-transmissive member 40 not including a wavelength-conversion member. Illustration of the support member or the like will be omitted in these figures.

Figure 16A:
FIGS. 16A to 16E are schematic cross-sectional views illustrating a method of manufacturing the light emitting device according to the fourth embodiment.
Figure 17:
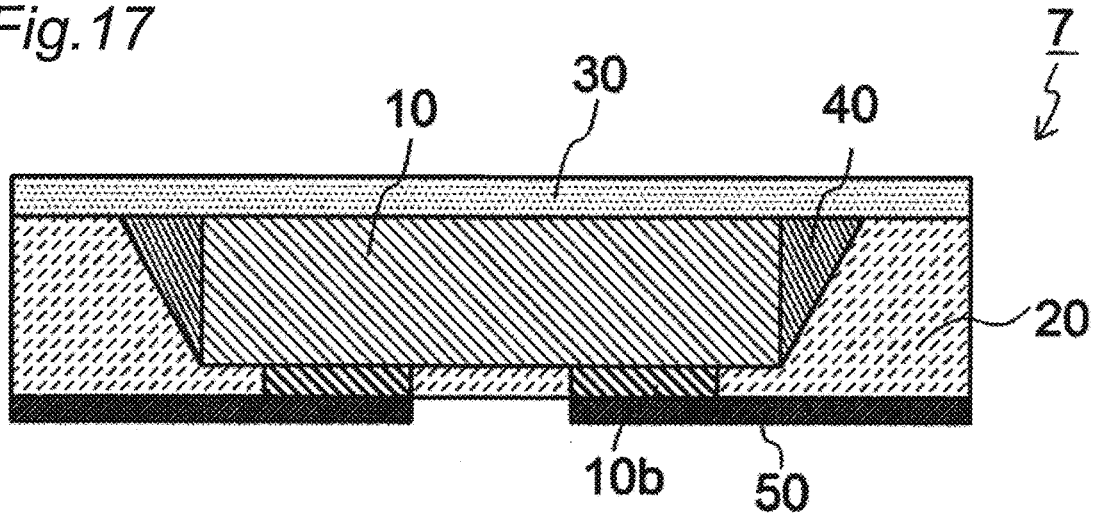
FIG. 17 is a cross-sectional view of a light emitting device according to another variant example of the first embodiment.

As illustrated in FIG. 16A, a plate member is provided that includes a reflective covering member 210 and the first light-transmissive member 30. For the covering member 210, for example, a member including about 60 wt % of white titanium oxide in a silicone resin can be used.

The covering member 210 can be obtained by a method which includes molding into a plate shape by compression molding, transfer molding, injection molding, printing, spraying, or the like, and creating a plurality of through holes in a plate-shaped body by punching or the like. Subsequently, the first light-transmissive members are formed in the through holes by potting, printing, spraying, or the like, so that a plate-shaped member including the covering member 210 and the first light-transmissive members 30 can be obtained.

Figure 16B:

Then, as shown in FIG. 16B, the liquid second light-transmissive members 40 are applied onto the first light-transmissive members 30 of the plate-shaped member. The liquid second light-transmissive members 40 are formed to be separated from each other. Each second light-transmissive member 40 can have any shape in a plan view corresponding to the shape of the light emitting element 10.

Examples of the shape of the second light-transmissive member 40 include circle, ellipse, square, and rectangle. The distance between the adjacent second light-transmissive members 40 can be selected as appropriate in accordance with the outer shape of the light emitting device 1 and the number of light emitting devices 1. The second light-transmissive members 40 are preferably formed to cover approximately 70% to 150% of the areas of the first light-transmissive members 30 of the plate-shaped member.

Figure 16C:
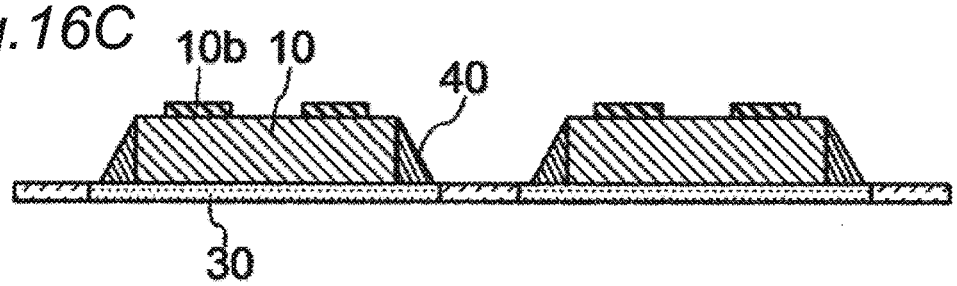

Then, as shown in FIG. 16C, the light emitting element 10 is arranged on each of the second light-transmissive members 40. When the light emitting element 10 is arranged on each of the second light-transmissive members 40 in the liquid state, the second light-transmissive members 40 each creeps up the lateral surface of the light emitting element 10. With this, the outer surface of the second light-transmissive member 40 has a shaped to face obliquely upward. After arranging the light emitting elements 10, the light emitting elements 10 may be pressed down as needed. The second light-transmissive members 40 in the liquid state are heated after arranging the light emitting elements 10, so that hardened second light-transmissive members 40 can be obtained.

Although the second light-transmissive member 40 disposed between the light emitting element 10 and the first light-transmissive member 30 is not shown in the figures, the second light-transmissive member in the form of a thin film is present between the light emitting element 10 and the first light-transmissive member 30, and also serves as an adhesive between the plate-shaped member and the light emitting element 10.

Figure 16D:
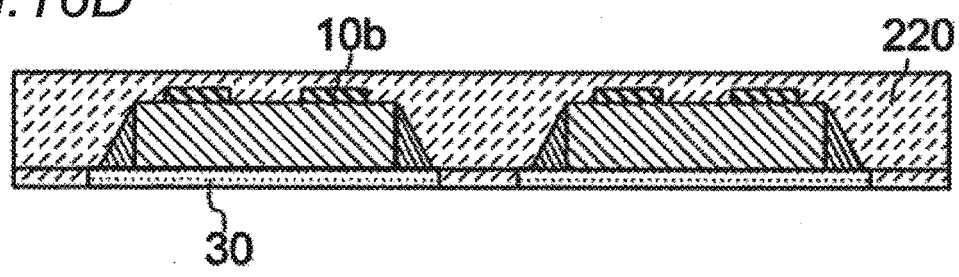

Then, as shown in FIG. 16D, a covering member 220 is arranged on an upper surface of the plate-shaped member so as to cover the light emitting elements 10 and the second light-transmissive members 40. The covering member 220 is arranged to integrally cover the plurality of light emitting elements 10. The covering member 220 in use can be, for example, a member including about 60 wt % of white titanium oxide in a silicone resin. The covering member 220 can be obtained by a method such as compression molding, transfer molding, injection molding, printing, or spraying.

Figure 16E:
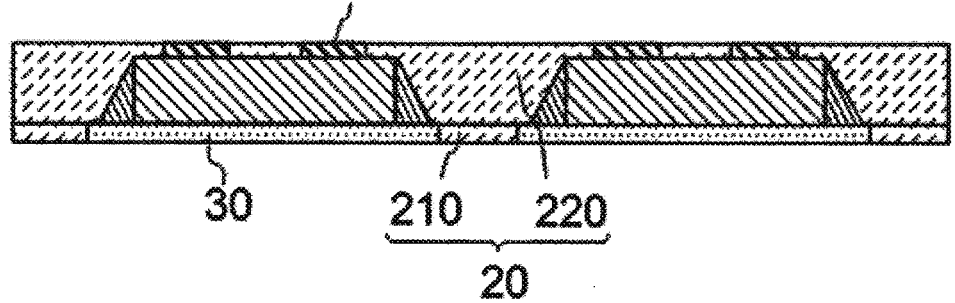

After hardening the covering member 220, as shown in FIG. 16E, the covering member 220 is thinned by a well-known processing method so as to expose the electrodes 10b of each of the light emitting elements 10. In this manner, the intermediate member 11 can be obtained.

In the above-described manufacturing method, the intermediate member 11 in which the covering member 20 is made of two parts has been described. That is, the covering member 210 covering the lateral surfaces of each of the first light-transmissive member 30 and the covering member 220 covering the lateral surfaces of each of the light emitting elements 10 (in detail, the lateral surfaces of each of the second light-transmissive members) are formed in different steps. The covering member 20 may be formed in two or more different steps in this way, or may be formed in a single step.

Intermediate Member 71

A light emitting device 7 shown in FIG. 17 differs from the light emitting device 1 described in the first embodiment in that the first light-transmissive member 30 is provided over the entire upper surface of the light emitting device 7.

In FIGS. 18A to 18E, a method of manufacturing an intermediate member 71 to obtain such a light emitting device 7 is illustrated. Illustration of the support member is omitted in these figures.

The intermediate member 71 includes the light emitting elements 10, the covering member 20, the first light-transmissive member 30 including a wavelength-conversion member, and the second light-transmissive member 40 not including a wavelength-conversion member.

Figure 18A:
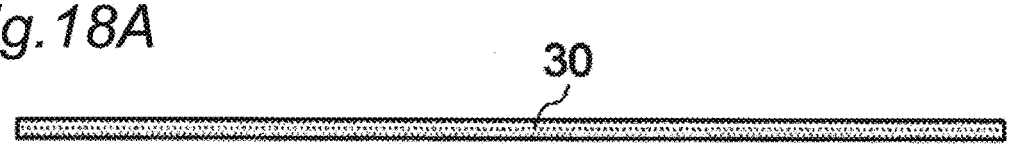
FIGS. 18A to 18E are schematic cross-sectional views illustrating a method of manufacturing the light emitting device shown in FIG. 17.
Figure 18B:
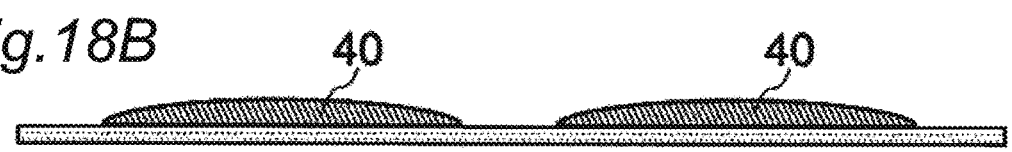
Figure 18C:
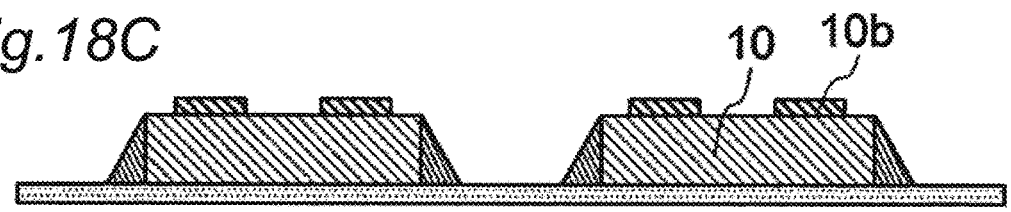
Figure 18D:
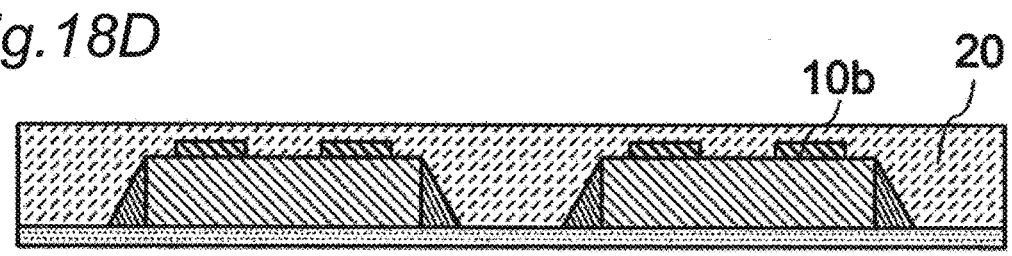
Figure 19:
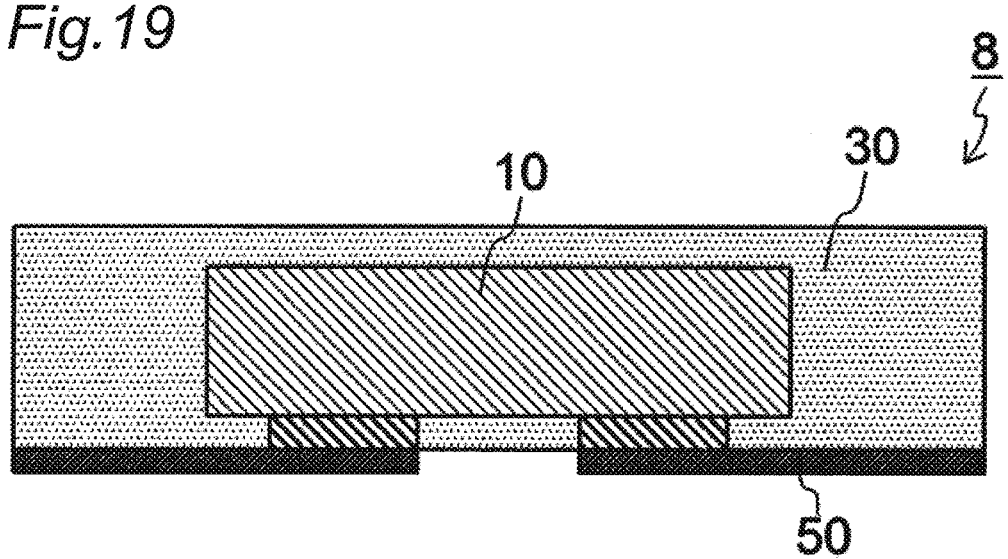
FIG. 19 is a schematic cross-sectional view of a light emitting device according to another variant example of the first embodiment.

As illustrated in FIG. 18A, first, the plate-shaped first light-transmissive member 30 is prepared. The plate-shaped first light-transmissive member 30 can be obtained, for example, by forming a liquid first light-transmissive member on a plate-shaped member separately prepared through printing, spraying, electrodeposition, etc. The term "plate shape" as used herein refers to the shape of a member with a large area on which a light emitting element can be arranged.

The expression "plate shape" may also be referred to as other expressions, including a sheet shape, a film shape, and a layer shape.

Subsequent steps after the step of applying the second light-transmissive member 40 in the liquid state onto the first light-transmissive member 30 can be performed in the same manner as those in the intermediate member 11 as described above, and thus will be omitted hereinafter. The second light-transmissive members 40 in the liquid state are disposed to be spaced apart from each other in view of the size of the light emitting device and the like.

A portion of the second light-transmissive member 40 disposed between the light emitting element 10 and the first light-transmissive member 30 is present in the form of a thin film similarly to the intermediate member 11, although not shown in the figures.

Figure 18E:
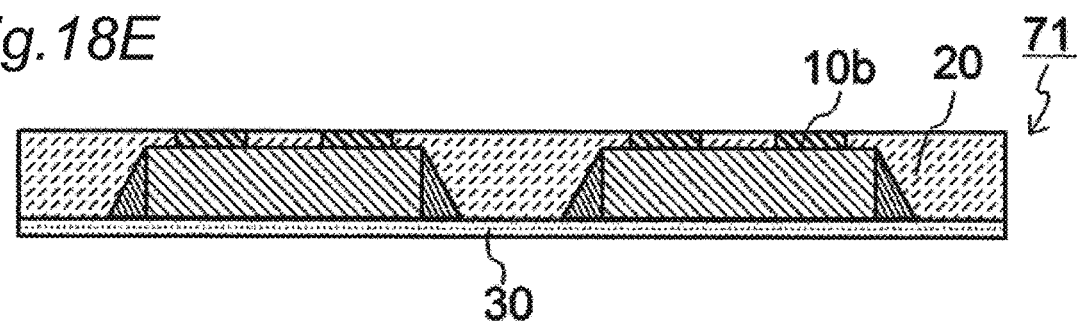

After hardening the covering member 20, as shown in FIG. 18E, the covering member 20 is thinned by a well-known processing method so as to expose the electrodes 10b of each of the light emitting elements 10. With this manner, the intermediate member 71 can be obtained.

Intermediate Member 81

A light emitting device 8 shown in FIG. 19 does not include a light-reflective covering member, and in the light emitting device 8, the first light-transmissive member 30 is arranged not only on the upper surface of the light emitting element, but also on the lateral surfaces of the light emitting element. That is, an intermediate member 81 differs from other intermediate members in that the covering member covering the light emitting element is light-transmissive. A method of manufacturing the intermediate member 81 to obtain such a light emitting device 8 is FIGS. 20A and 20B.

Figure 20A:
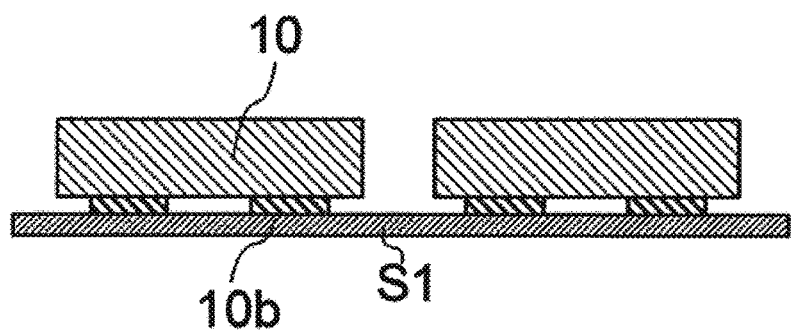
FIGS. 20A and 20B are schematic cross-sectional views illustrating a method of manufacturing the light emitting device shown in FIG. 19.
Figure 20B:
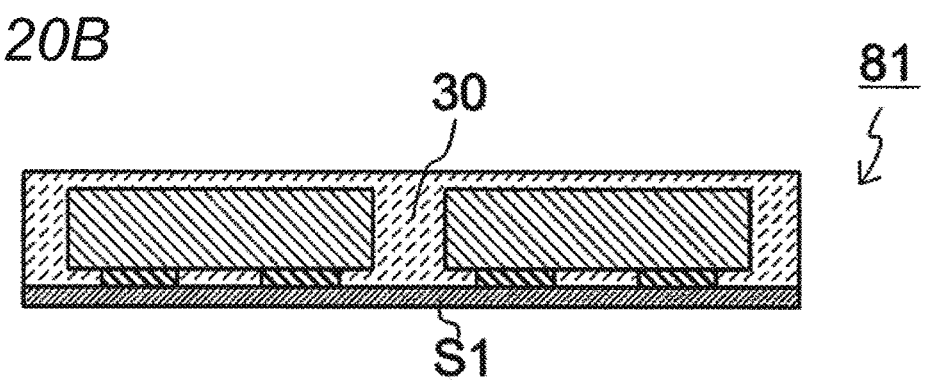

First, as shown in FIG. 20A, the light emitting elements 10 are disposed on the support member S1. At this time, the electrodes 10b are arranged to face the upper surface of the support member S1. Next, as shown in FIG. 20B, the first light-transmissive member 30 (and covering member 20) is formed to embed the light emitting elements 10. Thereafter, the support member S1 is removed, so that the intermediate member 81 can be obtained. In the case in which a material that can be easily oxidized is employed for the electrodes 10b, in the intermediate member 81 obtained in this manner, the surface of the electrodes 10b is preferably processed by grinding or the like after removing the support member S1. For example, in the case where Cu is used as the material for the electrodes 10b, surfaces of the electrodes 10b may be oxidized by being subjected to a heating process. In such a case, preferably, the oxidized surface of the intermediate member 81 is removed by grinding or the like to expose Cu, and then the metal layer is formed thereon.

For the intermediate member, the intermediate member 11, 71, or 81 described above, or an intermediate member obtained by removing a second light-transmissive member from the intermediate member 11 or 71 can be employed.

Light Emitting Element

For the light emitting element, for example, a semiconductor light emitting element such as a light-emitting diode configured to emit visible lights such as blue, green, or red light can be used. The semiconductor light emitting element includes a layered structure body including a light-emission layer and electrodes. The layered structure includes a surface on which the electrodes are formed (i.e., electrode formation surface) and a light extraction surface opposing the electrode formation surface.

The layered structure body includes semiconductor layers that include the light-emission layer. Furthermore, the layered structure may include a light-transmissive substrate made of sapphire. An example of the semiconductor layered body can include three kinds of semiconductor layers, namely, a first conductive-type semiconductor layer (e.g., n-type semiconductor layer), the light-emission layer (active layer), and a second conductive-type semiconductor layer (e.g., p-type semiconductor layer). The semiconductor layers that can emit ultraviolet light or visible lights in a range of blue light to green light can be made of, for example, semiconductor materials such as Group III-V compound semiconductors. More specifically, nitride-based semiconductor materials such as $In_xAl_yGa_{1-x-y}N$ ($0 \le X$, $0 \le Y$, $X+Y \le 1$) can be used. Examples of the semiconductor layered body that can emit red light include GaAs, GaAlAs, GaP, InGaAs, and InGaAsP.

Each of the light emitting elements includes a plurality of electrodes arranged at the same surface side (i.e., on the electrode formation surface) of the layered structure body. The plurality of electrodes may each have a single-layer structure or a multilayered structure that can be in ohmic contact with the layered structure body so as to exhibit linear or substantially linear current-voltage characteristics. Such electrodes can be formed to have any appropriate thickness using the material and structure known in the related art. For example, the electrode preferably has a thickness of about a dozen μm to 300 μm. The electrodes can each be made of a good electrical conductor.

A metal such as Cu can be suitably used for each of the electrodes. The shape of each of the electrodes can be selected from various shapes in accordance with the purpose, application, and the like. For example, as in a light emitting device 9 shown in FIG. 21, the electrodes 10b of the light emitting element can have shapes different from each other.

Metal Layer

The metal layer is a film that is formed to mainly prevent the corrosion and oxidation of the surface of each of the electrodes. A material having good resistance against corrosion and oxidation compared to the electrodes can be selected for a material of the metal layer. For example, the outermost surface layer of the metal layer is preferably made of a platinum-group metal such as Au or Pt. In the case in which the metal layer covers a surface of the light emitting device to be soldered, gold (Au), which has good solderability, is preferably used for the outermost surface of the metal layer.

The metal layer may be made of one layer of a single material, or may have a layered structure made of different material layers. Particularly, the metal layer having a high melting point is preferably used. Examples of the material used for this metal layer can include Ru, Mo, and Ta.

Arranging such a high-melting point metal between the electrode and outermost surface layer of the light emitting element allows the metal layer to serve as a diffusion-prevention layer that can reduce diffusion of Sn included in solder onto the electrode or a layer close to the electrodes. Examples of the layered structure including such a diffusion prevention layer include Ni/RuAu and Ti/Pt/Au. The diffusion prevention layer (made of, e.g., Ru layer) preferably has a thickness in a range of approximately 10 Å to 1,000 Å.

The thickness of the metal layer can be variously selected. More specifically, the thickness of the metal layer can be in a range that allows for selectively causing laser ablation such as, preferably, 1 μm or less, and more preferably 1,000 Å or less. Furthermore, the metal layer preferably has a thickness that allows for reducing corrosion of the electrode such as 5 nm or more. Here, in the case where a plurality of metal layers is layered, the expression "thickness of the metal layer" as used herein refers to the total thickness of the plurality of layers.

Covering Member

For the covering member, a resin member that mainly contains a thermosetting resin such as a silicone resin, a modified silicone resin, an epoxy resin, or a phenol resin as a main component is preferably used.

In the case where the covering member has a shape as that in the intermediate member 11, 61, or 71, the covering member is preferably a light-reflective resin member. The term "light-reflective resin" as used herein refers to a resin material having a reflectance of 70% or higher with respect to light emitted from the light emitting element. For example, white resin or the like is preferable. The light reaching the covering member is reflected by the covering member to propagate toward the light-emission surface of the light emitting device, which allows for increasing light extraction efficiency of the light emitting device. In the case where the covering member has a shape as that in the intermediate member 81, the covering member is preferably a light-transmissive resin member. In this case, for the covering member, a material similar to the material used for the light-transmissive member to be described below can be used.

The light-reflective resin in use can be, for example, a light-transmissive resin in which a light-reflective substance is dispersed. Examples of a material suitable for the light-reflective substance include titanium oxides, silicon oxides, zirconium oxides, potassium titanates, aluminum oxides, aluminum nitrides, boron nitrides, and mullites. A particle shaped, fiber shape, thin-plate shape, or the like may be employed for the shape of the light-reflective material. In particular, with the light-reflective material having a fiber shape, the effect of reducing the thermal expansion rate of the covering member can be expected, and thus is preferable.

For example, in the case where the covering member 20 is made of a resin member containing a filler such as the light-reflective substance, a resin component on the surface irradiated with the laser light is removed by laser ablation, so that the filler is exposed at the surface of the covering member. By continuously or sequentially transferring the irradiation spot of laser light over the surface, a stripe-shaped groove can be formed in the movement direction. The groove is formed, for example, with a width of approximately 10 to 100 μm, typically 40 μm, and with a depth of 0.1 to 3 μm, according to the diameter of the irradiation spot of the laser light.

Light-Transmissive Member

The light-transmissive member covers the upper surface of the light emitting element (i.e., the surface opposing the electrode formation surface and serving as the light-emission surface), the lateral surfaces of the light emitting element, and the like. A light-transmissive resin, glass, or the like can be used for a light-transmissive material of the light-transmissive member. In particular, a light-transmissive resin is preferably used. Examples of such a light-transmissive resin include a thermosetting resin such as silicone resin, modified silicone resin, epoxy resin, and phenolic resin, and thermoplastic resin such as polycarbonate resin, acrylic resin, methylpentene resin, and polynorbornene resin. In particular, a silicone resin, which has good light resistance and heat resistance, is preferable.

The light-transmissive member may include a phosphor as the wavelength-conversion member, in addition to the above-described light-transmissive material. For the phosphor, a phosphor that can be excited with light emitted from the light-emitting element. Examples of the phosphor that can be excited with the light from a blue light-emitting element or an UV light-emitting element can include an yttrium aluminum garnet based phosphor activated with cerium (YAG:Ce), a lutetium aluminum garnet based phosphor activated with cerium (LAG:Ce), a nitrogen-containing calcium aluminosilicate based phosphor ($CaO$—$Al_2O_3$—$SiO_2$) activated with europium and/or chromium, a silicate based phosphor (($Sr$, $Ba$)$_2SiO_4$) activated with europium, nitride based phosphors such as β-sialon phosphors, CASN based phosphors, and SCASN based phosphors, KSF based phosphors ($K_2SiF_6$:Mn), sulfide based phosphors, and quantum-dot phosphors. The combination of these phosphors and the blue-light emitting element or UV-light emitting element allows for manufacturing light emitting devices configured to emit various colors (e.g., a light emitting device for emitting white-based light).

Various kinds of fillers and the like may be included in the light-transmissive member for the purpose of adjusting its viscosity.

As shown in FIG. 1C, the light emitting device may include the first light-transmissive member including the wavelength conversion member on the light-emission surface of the light emitting element (i.e., on the surface opposing the surface provided with the electrodes) and the second light-transmissive member not including the wavelength-conversion member on the lateral surfaces of the light emitting element. In such a case, a light-transmissive material same as the light-transmissive material described above can be used, while the first light-transmissive member and the second light-transmissive member are different from each other in whether or not containing the wavelength-conversion member. The light-transmissive material used in the first light-transmissive member may be the same or different from the light-transmissive material used in the second light-transmissive member. The above-described phosphors can be used for the wavelength-conversion member included in the first light-transmissive member.

While some embodiments according to the present invention have been exemplified above, it is apparent that the present invention is not limited to the above-mentioned embodiments and can have any form without departing from the scope of the present invention.

DESCRIPTION OF REFERENCE NUMERALS 1, 2, 3, 4, 5, 6, 7, 8, 9, 1a: Light emitting device
11, 31, 61, 71, 81: Intermediate member
10: Light emitting element
10a: Layered structure body
10b: Electrode
20, 210, 220: Covering member
30: First light-transmissive member
40: Second light-transmissive member
50, 50a, 50b, 50c, 50d: External connection electrode
501: Recess of external connection electrode
150, 250: Metal layer
S1, S2: Support member
L1, L2, L3, L4: Laser-light irradiation region

What is claimed is:

1. A light emitting device comprising:
a first light emitting element that comprises a pair of first electrodes located at a lower surface of the first light emitting element;
a second light emitting element that comprises a pair of second electrodes located at a lower surface of the second light emitting element;
a covering member that integrally covers the first and second light emitting elements such that lower surfaces of the pair of first electrodes and lower surfaces of the pair of second electrodes are exposed from a lower surface of the covering member;
a pair of first external connection electrodes, each comprising:
a first portion, an entirety of which covers the lower surface of a respective first electrode, and
a second portion, which is an entirety of the external connection electrode other than the first portion that covers the lower surface of the respective first electrode, wherein the second portion covers a portion of the lower surface of the covering member that is located around the lower surface of the respective first electrode; and
a pair of second external connection electrodes, each comprising:
a first portion that covers the lower surface of a respective second electrode, and
a second portion that covers a portion of the lower surface of the covering member that is located around the lower surface of the respective second electrode, wherein:
a distance between the first portions of the first external connection electrodes is smaller than a distance between the second portions of the first external connection electrodes; and
a distance between a first electrode and a second electrode that are closest to each other among the first electrodes and the second electrodes is larger than a distance between a first external connection electrode and a second external connection electrode that are closest to each other among the first external connection electrodes and the second external connection electrodes.

2. The light emitting device according to claim 1, wherein the distance between the first portions of the first external connection electrodes is larger than the distance between the first external connection electrode and the second external connection electrode that are closest to each other among the first external connection electrodes and the second external connection electrodes.

3. The light emitting device according to claim 1, wherein in a bottom plan view, the second portion of each first external connection electrode comprises two extension portions that continuously extend from opposite sides of the first portion in opposite directions, and
wherein each of the two extension portions comprises an edge, and the edges of the two extension portions are colinear.

4. The light emitting device according to claim 1, wherein, in a bottom plan view, edges of the first and second external connection electrodes are apart from edges of a lower surface of the light emitting device.

5. The light emitting device according to claim 1, wherein, in a bottom plan view, the first and second external connection electrodes extend to edges of a lower surface of the light emitting device.

6. The light emitting device according to claim 1, comprising a plurality of light emitting elements including the first and second light emitting elements, wherein
the plurality of light emitting elements are arranged in rows and columns.

7. The light emitting device according to claim 1, wherein in a plan view, at least one corner of the light emitting element is overlapped with the first external connection electrode.

8. The light emitting device according to claim 1, wherein in a plan view, each of the first and second light emitting elements has a square shape, and the light emitting device has a rectangular shape.

9. The light emitting device according to claim 1, wherein:
each of the first and second light emitting elements has an upper surface opposed to the lower surface, and
the light emitting device further comprises a plurality of light-transmissive members, each of which is located on an upper surface of a respective light emitting element.

10. The light emitting device according to claim 9, the light-transmissive members include a phosphor.

11. The light emitting device according to claim 1, wherein the covering member is made of white resin.

12. The light emitting device according to claim 1, wherein:
each lower surface of the pair of first electrodes exposed from the covering member is entirely covered by one of the first external connection electrodes, and
each lower surface of the pair of second electrodes exposed from the covering member is entirely covered by one of the second external connection electrodes.

13. The light emitting device according to claim 1, wherein:
each first external connection electrode extends in a direction away from the adjacent first external connection electrode, and
each second external connection electrode extends in a direction away from the adjacent second external connection electrode.

14. The light emitting device according to claim 1, wherein each first electrode is separated from each second electrode.

* * * * *